United States Patent
Agrawal et al.

(10) Patent No.: US 12,543,351 B2
(45) Date of Patent: Feb. 3, 2026

(54) ENRICHED SEMICONDUCTOR NANORIBBONS FOR PRODUCING INTRINSIC COMPRESSIVE STRAIN

(71) Applicant: Intel Corporation, Santa Clara, CA (US)

(72) Inventors: Ashish Agrawal, Hillsboro, OR (US); Anand Murthy, Portland, OR (US); Jack T. Kavalieros, Portland, OR (US); Rajat K. Paul, Portland, OR (US); Gilbert Dewey, Beaverton, OR (US); Seung Hoon Sung, Portland, OR (US); Susmita Ghose, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 889 days.

(21) Appl. No.: 17/523,710

(22) Filed: Nov. 10, 2021

(65) Prior Publication Data
US 2023/0147499 A1    May 11, 2023

(51) Int. Cl.
*H10D 62/10* (2025.01)
*H10D 30/67* (2025.01)

(52) U.S. Cl.
CPC ....... *H10D 62/121* (2025.01); *H10D 30/6713* (2025.01); *H10D 30/6735* (2025.01); *H10D 30/6748* (2025.01)

(58) Field of Classification Search
CPC ............. H10D 62/121; H10D 30/6713; H10D 30/6735; H10D 30/6748; H10D 84/0188;
(Continued)

(56) References Cited

U.S. PATENT DOCUMENTS 9,870,984 B2 * 1/2018 Ranmuthu .............. H01L 24/41
11,557,659 B2 * 1/2023 Wang et al.
(Continued)

OTHER PUBLICATIONS

Takase et al. J. Appl. Phys. Dec. 28, 2016; 120 (24) (Year: 2016).*
(Continued)

*Primary Examiner* — Christine S. Kim
*Assistant Examiner* — Nathalie R Fayette
(74) *Attorney, Agent, or Firm* — Arcane Law PLLC

(57) ABSTRACT

Techniques are provided herein to form semiconductor devices having strained channel regions. In an example, semiconductor nanoribbons of silicon germanium (SiGe) or germanium tin (GeSn) may be formed and subsequently annealed to drive the germanium or tin inwards along a portion of the semiconductor nanoribbons thus increasing the germanium or tin concentration through a central portion along the lengths of the one or more nanoribbons. Specifically, a nanoribbon may have a first region at one end of the nanoribbon having a first germanium concentration, a second region at the other end of the nanoribbon having substantially the same first germanium concentration (e.g., within 5%), and a third region between the first and second regions having a second germanium concentration higher than the first concentration. A similar material gradient may also be created using tin. The change in material composition (gradient) along the nanoribbon length imparts a compressive strain.

20 Claims, 10 Drawing Sheets

(58) Field of Classification Search
CPC .... H10D 18/01; H10D 44/474; H10D 64/252; H10D 84/201; H10D 84/903; H10D 18/60; H10D 84/0107; H10D 84/619; H10D 84/83; H10D 86/0221; B65D 83/141; A61K 40/4218; H01L 21/324; H01L 21/477; H02K 15/027; H10H 20/826; B82Y 10/00; B82Y 40/00; A23B 2/605; A23B 2/783; A45C 11/003; H10F 30/2863

See application file for complete search history.

(56) References Cited

U.S. PATENT DOCUMENTS

| | | | |
|---|---|---|---|
| 2011/0070734 | A1 | 3/2011 | Saracco et al. |
| 2014/0203327 | A1 | 7/2014 | Pillarisetty et al. |
| 2016/0329400 | A1 | 11/2016 | Wen et al. |
| 2018/0151452 | A1* | 5/2018 | Doornbos et al. ... H10D 62/117 |
| 2018/0204955 | A1 | 7/2018 | Mehandru et al. |
| 2020/0144133 | A1 | 5/2020 | Wang et al. |
| 2020/0286992 | A1 | 9/2020 | Song et al. |
| 2020/0294969 | A1* | 9/2020 | Rachmady et al. ... H10D 30/62 |
| 2020/0357931 | A1 | 11/2020 | Lee et al. |
| 2021/0232744 | A1* | 7/2021 | Lin et al. ......... H03K 3/356113 |
| 2021/0296506 | A1 | 9/2021 | Wei et al. |
| 2021/0343858 | A1 | 11/2021 | Wang et al. |
| 2023/0141914 | A1* | 5/2023 | Agrawal et al. ...... H01L 29/423 257/401 |

OTHER PUBLICATIONS

Coplanar definition, Collins English Dictionary—Complete and Unabridged, 12th Edition 2014. (1991, 1994, 1998, 2000, 2003, 2006, 2007, 2009, 2011, 2014). Retrieved Feb. 3, 2025 (Year: 2025).*

Extended European Search Report received for EP application No. 22200110.9, dated Mar. 23, 2023. 11 pages.

Extended European Search Report received for EP Application No. 22200636.3, dated Apr. 11, 2023. 12 pages.

\* cited by examiner

ENRICHED SEMICONDUCTOR NANORIBBONS FOR PRODUCING INTRINSIC COMPRESSIVE STRAIN

FIELD OF THE DISCLOSURE

The present disclosure relates to integrated circuits, and more particularly, to strained channel regions in semiconductor devices.

BACKGROUND

As integrated circuits continue to scale downward in size, a number of challenges arise. For instance, reducing the size of memory and logic cells or otherwise increasing transistor density is becoming increasingly more difficult. Different transistor architectures that maximize available semiconductor surfaces to form active channels have been contemplated, including nanowire, nanoribbon or nanosheet (gate-all-around) and forksheet architectures. However, such architectures come with drawbacks with regards to the strain placed on the semiconductor channels. For some devices, not enough strain can lead to poor device performance. Accordingly, there remain a number of non-trivial challenges with respect to forming certain transistor structures while maintaining a sufficient degree of strain on the semiconductor channels.

Figure 1A:
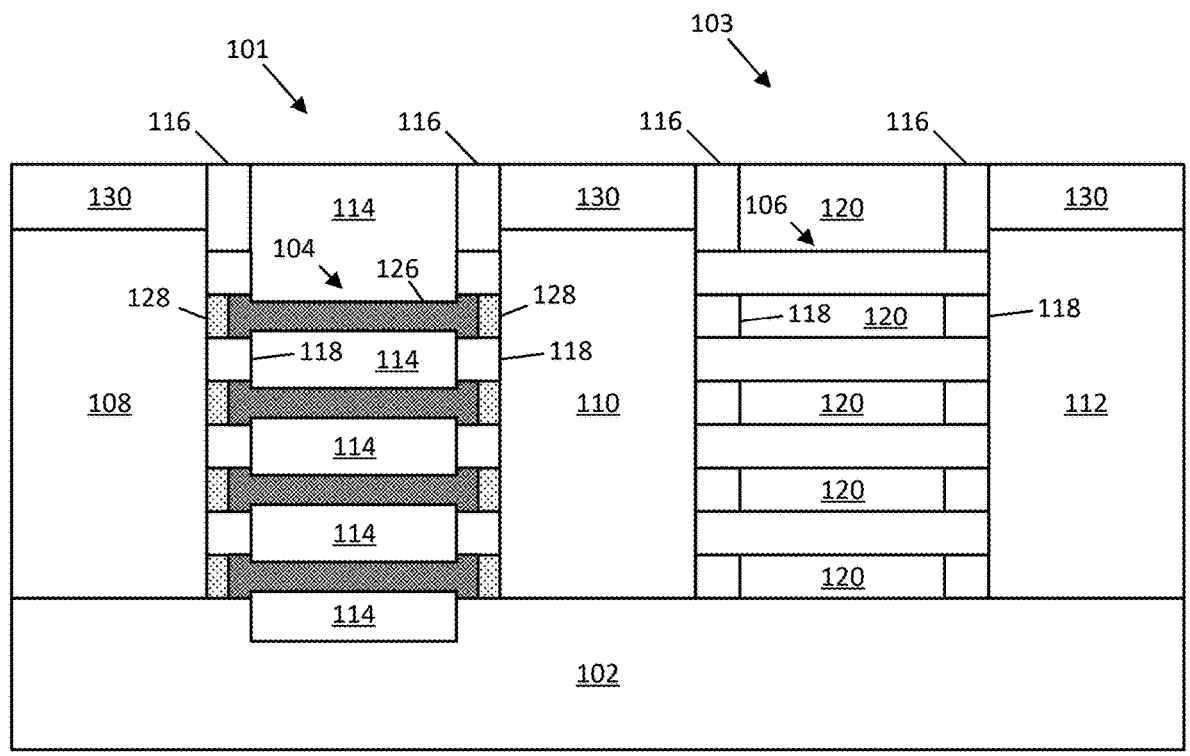
FIGS. 1A and 1B are cross-sectional views of semiconductor devices that illustrate a set of thinner, strained nanoribbons on one of the semiconductor devices, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., tapered sidewalls and rounded corners), and some features may have surface topology or otherwise be non-smooth, given real world limitations of the processing equipment and techniques used.

DETAILED DESCRIPTION

Techniques are provided herein to form semiconductor devices having channel regions with an increased strain. The techniques are particularly useful with respect to gate-all-around (e.g., nanoribbon and nanosheet) and forksheet transistor configurations. Imparting strain upon the semiconductor channel of a transistor can lead to a higher device performance. In some examples, semiconductor nanoribbons of silicon germanium (SiGe) or germanium tin (GeSn) may be formed and subsequently annealed to drive the germanium or tin inwards along a portion of the semiconductor nanoribbons thus increasing the germanium or tin concentration through a central portion along the lengths of the one or more nanoribbons. Specifically, in some examples, at least one of one or more silicon or silicon germanium nanoribbons includes a first region at one end of the nanoribbon having a first germanium concentration, a second region at the other end of the nanoribbon having substantially the same first germanium concentration (e.g., within 5%), and a third region between the first and second regions having a second germanium concentration higher than the first concentration. A similar material gradient may also be created using tin, in germanium nanoribbons, according to some examples. The change in material composition (gradient) along the length of the one or more nanoribbons imparts a compressive strain in the nanoribbon channel. Such strain is especially helpful for PMOS devices having lower minority carrier mobility. Numerous variations and embodiments will be apparent in light of this disclosure.

General Overview

Gate-all-around (GAA) and forksheet device architectures have source, drain and gate structures that are isolated from the sub fin layer to reduce parallel conduction between the source/drain and the substrate and to reduce parasitic capacitance between the gate and the substrate. However, isolating the source and drain regions from the substrate can result in a loss of compressive strain in the channel, which can cause significant degradation in PMOS performance. This loss of strain is particularly problematic as devices continue to scale smaller. For instance, mechanically imparting strain to the nanoribbons by way of the gate structure and/or epitaxial deposition of diffusion regions (source and drain regions) becomes more difficult as gate structures and diffusion regions become too small to impart any significant strain.

Thus, and in accordance with an embodiment of the present disclosure, techniques are provided herein to form semiconductor devices with intrinsically strained channels. The strain is said to be intrinsic, as the strain is induced from the channel material itself, rather than from an adjacent gate structure or diffusion region. Such techniques are especially useful for gate all around (GAA) or forksheet transistors that utilize one or more nanoribbons or nanosheets as the semiconductor channel between a source and drain region. According to some embodiments, for a given device where a compressive strain is desired (such as for a PMOS device), semiconductor layers of either silicon germanium or germanium tin may be used as opposed to traditional silicon layers. The exact material composition may vary depending on the application, but in the example case of silicon germanium layers, an anneal process is used to drive the germanium inwards from the exposed surfaces of the semiconductor layers thus creating a higher Ge concentration along a thinner portion of the semiconductor layers. This leads to one or more nanoribbons that exhibit a change in their material composition (e.g., a concentration gradient) along a length of the one or more nanoribbons. According to an embodiment, a given nanowire may exhibit a first germanium concentration at a first end and an opposite second end of the nanowire (e.g. beneath a spacer structure), and a second germanium concentration higher than the first concentration along the length of the nanowire between the first and second ends. A similar concentration gradient can also be formed with tin based on germanium tin semiconductor layers. Additionally, due to an affect of the annealing process, the one or more nanoribbons may be thinner compared to other nanoribbons that do not contain Ge or Sn. Further note that, although nanoribbons may be used in examples herein, the techniques similarly apply to nanosheets and other such relatively thin semiconductor bodies that can be used for transistor channels and are otherwise susceptible to inadequate strain externally induced from the adjacent gate structure and/or diffusion regions. To this end, the use of nanosheet (or nanoribbon) is intended to include all such semiconductor bodies. Numerous variations and embodiments will be apparent in light of this disclosure.

According to an embodiment, an integrated circuit includes a semiconductor device having one or more semiconductor nanoribbons extending in a first direction between a source region and a drain region, a first spacer structure that extends in a second direction orthogonal to the first direction and around first ends of the one or more semiconductor nanoribbons, a second spacer structure that extends in the second direction and around second ends of the one or more semiconductor nanoribbons, and a gate structure around the one or more semiconductor nanoribbons and between the first and second spacer structures. At least one nanoribbon of the one or more semiconductor nanoribbons includes a first region at one end of the nanoribbon having a first germanium (Ge) concentration, a second region at the other end of the nanoribbon having the first Ge concentration (e.g., such that the Ge concentration of the end portions are within 5% of each other, or 2%, or 1%), and a third region between the first and second regions. The third region has a second Ge concentration greater than the first Ge concentration (e.g., 10% greater, or more).

According to another embodiment, an integrated circuit includes a semiconductor device having one or more semiconductor nanoribbons extending in a first direction between a source region and a drain region, a first spacer structure that extends in a second direction orthogonal to the first direction and around first ends of the one or more semiconductor nanoribbons, a second spacer structure that extends in the second direction and around second ends of the one or more semiconductor nanoribbons, and a gate structure around the one or more semiconductor nanoribbons and between the first and second spacer structures. At least one nanoribbon of the one or more semiconductor nanoribbons includes a first region at one end of the nanoribbon having a first tin (Sn) concentration, a second region at the other end of the nanoribbon having the first Sn concentration, and a third region between the first and second regions. The third region has a second Sn concentration greater than the first Sn concentration.

According to another embodiment, a method of forming an integrated circuit includes forming a multilayer fin having first material layers alternating with second material layers, the second material layers comprising silicon (Si) and germanium (Ge); forming sidewall spacer structures around exposed ends of the second material layers; removing the first material layers to form suspended second material layers; annealing the suspended second material layers to drive the Ge towards a center of each of the second material layers between the sidewall spacer structures; and removing an oxide layer from around the suspended second material layers.

The techniques can be used with any type of non-planar transistors but are especially useful for nanowire and nanoribbon transistors (sometimes called GAA transistors or forksheet transistors), to name a few examples. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate structure can be implemented with a gate-first process or a gate-last process (sometimes called a replacement metal gate, or RMG, process). Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED or NanoED), and reflection electron microscopy (REM); composition mapping; x-ray crystallography or diffraction (XRD); Raman spectroscopy; energy-dispersive x-ray spectroscopy (EDX); electron energy loss spectroscopy (EELS); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate thinner nanoribbons for some devices (e.g., PMOS devices) compared to other devices (e.g., NMOS devices). In some examples, the thinner nanoribbons may be between 2 nm and about 8 nm thinner compared to other nanoribbons. In some embodiments, such tools may indicate a change in material composition along the length of a given nanoribbon, with or without thinning of the nanoribbons. For example, a nanoribbon may exhibit first and second ends under spacer structures that have a first germanium concentration, while showing a second higher germanium concentration along a length of the nanoribbon between the first and second ends. In another example, a nanoribbon may exhibit first and second ends under spacer structures that have a first tin concentration, while showing a second higher tin concentration along a length of the nanoribbon between the first and second ends. So, for example, TEM and/or SEM cross-sections, EDX, and EELS can be used to reveal SiGe having a first Ge concentration in the channel region under a gate structure and SiGe having a second lower Ge concentration underneath the gate spacer for PMOS devices; in addition, XRD and Raman spectroscopy can be used to show evidence of strain in the channel. In some embodiments, the thinned nanoribbons may lie on different horizontal planes compares to non-thinned nanoribbons of other devices (e.g., the thinned nanoribbons are different heights off of the substrate surface compares to the non-thinned nanoribbons). Note that nanoribbons are used in these examples, but the present description equally applies to nanosheet and forksheet configurations.

It should be readily understood that the meaning of "above" and "over" in the present disclosure should be interpreted in the broadest manner such that "above" and "over" not only mean "directly on" something but also include the meaning of over something with an intermediate feature or a layer therebetween. As used herein, the term "backside" generally refers to the area beneath one or more semiconductor devices (below the device layer) either within the device substrate or in the region of the device substrate (in the case where the bulk of the device substrate has been removed). Note that the backside may become a frontside, and vice-versa, if a given structure is flipped. To this end, and as will be appreciated, the use of terms like "above" "below" "beneath" "upper" "lower" "top" and "bottom" are used to facilitate discussion and are not intended to implicate a rigid structure or fixed orientation; rather such terms merely indicate spatial relationships when the structure is in a given orientation.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Architecture

Figure 1B:
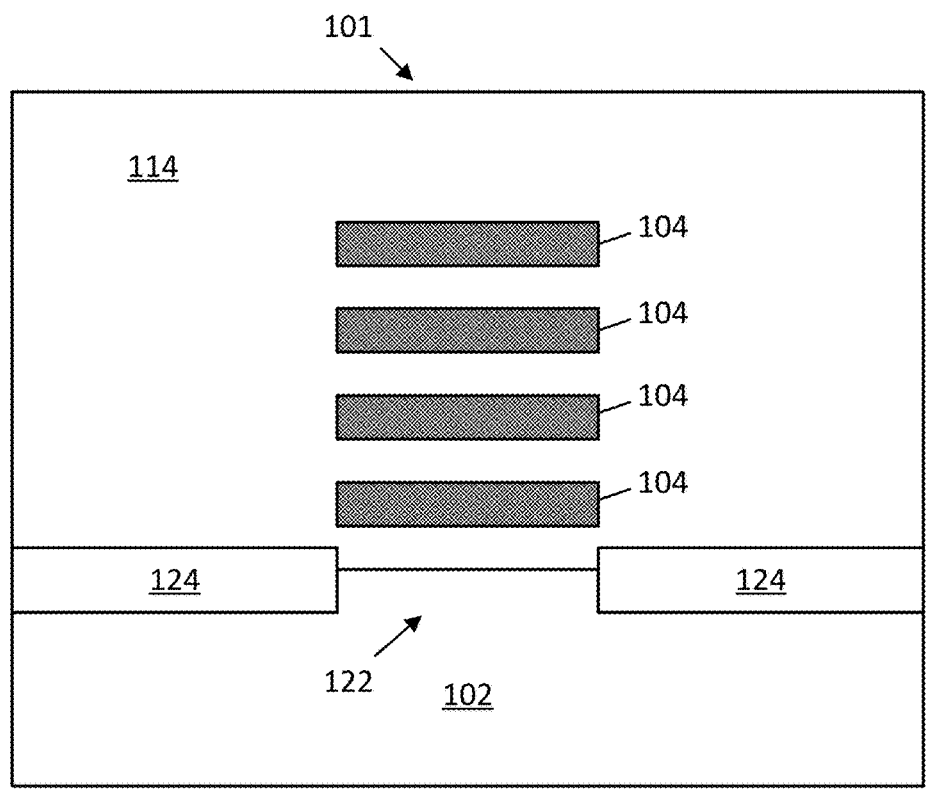

FIG. 1A is a cross-sectional view taken across a first semiconductor device 101 and a second semiconductor device 103, according to an embodiment of the present disclosure. FIG. 1B is a cross-sectional view taken in an orthogonal direction across first semiconductor device 101. Each of first and second semiconductor devices 101 and 103 may be any type of non-planar metal oxide semiconductor (MOS) transistor, such as a tri-gate, gate-all-around (GAA), or forksheet transistor, although other transistor topologies and types could also benefit from the techniques provided herein. The illustrated embodiments herein use the GAA structure.

First and second semiconductor devices 101 and 103 together represent a portion of an integrated circuit that may contain any number of similar and/or other semiconductor devices. Additionally, first and second semiconductor devices 101 and 103 are provided side-by-side for clarity and for ease of discussion when comparing and contrasting the devices. However, second semiconductor device 103 could exist anywhere else within the integrated circuit and is not required to be linked with first semiconductor device 101 via a shared source or drain region. The arrangement of first semiconductor device 101 sharing a source or drain region with second semiconductor device 103 may be used in various circuit or cell structures, such as an inverter, logic cell, memory cell, or complementary metal oxide semiconductor (CMOS) cell.

As can be seen, semiconductor devices 101 and 103 are formed on a substrate 102, in this example case. Any number of other semiconductor devices can be formed on substrate 102, but two are illustrated here as an example. Substrate 102 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 102 can be a semiconductor-on-insulator substrate having a desired semiconductor layer over a buried insulator layer (e.g., silicon over silicon dioxide). Alternatively, substrate 102 can be a multilayer substrate or superlattice suitable for forming nanowires or nanoribbons (e.g., alternating layers of silicon and SiGe, or alternating layers indium gallium arsenide and indium phosphide). Any number of substrates can be used.

First semiconductor device 101 may include any number of semiconductor nanoribbons 104 while second semiconductor device 103 similarly may include any number of semiconductor nanoribbons 106. Nanoribbons 104 may extend between a source region 108 and a drain region 110. Likewise, nanoribbons 106 may extend between a source region 112 and drain region 110. Any source region may also act as a drain region and vice versa, depending on the application. Furthermore, as noted above, nanoribbons 106 of second semiconductor device 103 may extend between source region 112 and a drain region that is different from drain region 110, according to other example embodiments. In some embodiments, any of nanoribbons 104 or nanoribbons 106 are shaped like nanowires having a substantially circular cross-section.

According to some embodiments, nanoribbons 104 of first semiconductor device 101 are not co-planar with nanoribbons 106 of second semiconductor device 103. For example, nanoribbons 104 may exhibit a staggered relationship with nanoribbons 106, such that nanoribbons 104 are co-planar with the spaces between nanoribbons 106. The difference in heights between nanoribbons 104 and nanoribbons 106 is created due to which layers are removed during the fabrication of the suspended nanoribbons, as discussed in more detail herein.

In some embodiments, semiconductor devices 101 and 103 have an equal number of nanoribbons, while in other embodiments they have an unequal number of nanoribbons. In some embodiments, each of nanoribbons 104 and nanoribbons 106 are formed from a fin of alternating material layers (e.g., alternating layers of silicon and silicon germanium) where sacrificial material layers are removed between nanoribbons 104 and nanoribbons 106. In some embodiments, the sacrificial layers removed from the fin of first semiconductor device 101 are different from those removed from the fin of second semiconductor device 103, yielding nanoribbons at different heights between the two semiconductor devices. Each of nanoribbons 104 and nanoribbons 106 may include the same semiconductor material as substrate 102, or not. In still other cases, substrate 102 is removed. In some such cases, there may be, for example one or more backside interconnect and/or contact layers. According to some embodiments, semiconductor device 101 is a p-channel device having semiconductor nanoribbons 104 doped with n-type dopants (e.g., phosphorous or arsenic) and semiconductor device 103 is an n-channel device having semiconductor nanoribbons 106 doped with p-type dopants (e.g., boron).

According to some embodiments, source and drain regions 108/110/112 are epitaxial regions that are provided using an etch-and-replace process. In other embodiments any of the source and drain regions could be, for example, implantation-doped native portions of the semiconductor fins or substrate. Any semiconductor materials suitable for source and drain regions can be used (e.g., group IV and group III-V semiconductor materials). The source and drain regions may include multiple layers such as liners and capping layers to improve contact resistance and/or induce strain. In any such cases, the composition and doping of the source and drain regions may be the same or different, depending on the polarity of the transistors. Any number of source and drain configurations and materials can be used.

According to some embodiments, the fins or semiconductor material can be formed of material deposited over the underlying substrate 102. In one such example case, a blanket layer of silicon germanium (SiGe) can be deposited over a silicon substrate, and then patterned and etched to form a plurality of SiGe fins or nanoribbons. In another such example, the fins include alternating layers of material (e.g., alternating layers of silicon and SiGe) that facilitates forming of nanowires and nanoribbons during a gate forming process where one type of the alternating layers are selectively etched away so as to release the other type of alternating layers within the channel region, so that a gate-all-around (GAA) process can then be carried out. The alternating layers can be blanket deposited and then etched into fins, or deposited into fin-shaped trenches.

According to some embodiments, a first gate structure 114 is provided over each of nanoribbons 104 between spacer structures 116 and internal spacers 118. Similarly, a second gate structure 120 is provided over each of nanoribbons 106 between spacer structures 116 and internal spacers 118. Each of first and second gate structures 114 and 120 include both a gate dielectric around the corresponding nanoribbons and a gate electrode over the gate dielectric. The gate dielectric may also be deposited along sidewalls and the bottom of the trench between spacer structures 116 and internal spacers 118. The gate dielectric may include a single material layer or multiple stacked material layers. In some embodiments, the gate dielectric includes a first dielectric layer such as silicon oxide and a second dielectric layer that includes a high-k material such as hafnium oxide. The hafnium oxide may be doped with an element to affect the threshold voltage of the given semiconductor device. According to some embodiments, the doping element used in the gate dielectric is lanthanum.

According to some embodiments, first and second gate structures 114 and 120 include a gate electrode that extends over the gate dielectric around each of nanoribbons 104 and 106, respectively. The gate electrode may include any sufficiently conductive material such as a metal (e.g., tungsten, cobalt, titanium, ruthenium, aluminum, molybdenum), metal alloy, or doped polysilicon. According to some embodiments, the gate electrode may be interrupted between any other semiconductor devices by a gate cut structure. In some embodiments, the gate electrode includes one or more work-function metals around the corresponding nanoribbons. For example, first semiconductor device 101 may be a p-channel device that includes n-type dopants within nanoribbons 104 and includes a work-function metal having titanium around nanoribbons 104. In another example, second semiconductor device 103 is an n-channel device that includes p-type dopants within nanoribbons 104 and includes a work-function metal having tungsten around nanoribbons 104. In some embodiments, first and second gate electrodes 114 and 120 each includes a fill metal or other conductive material around the work-function metal(s) to provide the whole gate electrode structure.

According to some embodiments, first gate structure 114 extends below the bottom nanoribbon 104 of first semiconductor device 101 and beneath a top surface of substrate 102. As shown more clearly in FIG. 1B, a sub fin 122 beneath nanoribbons 104 is recessed beneath a top surface of a dielectric fill 124 on either side of first semiconductor device 101. The recessing of sub fin 122 may be performed to release the bottom nanoribbon 104, as will be discussed in more detail herein. Dielectric fill 124 may act as shallow trench isolation (STI) structures between first semiconductor device 101 and any neighboring semiconductor devices. Dielectric fill 124 may be any suitable dielectric material, such as, for example, silicon dioxide, aluminum oxide, or silicon oxycarbonitride.

According to some embodiments, at least one of nanoribbons 104 includes a material concentration gradient along its length that differentiates the at least one nanoribbon into at least two sections. For example, a first section 126 extends along a length of nanoribbon 104 and is between a second section 128 at either end of nanoribbon 104. In this example case, note how first section 126 extends somewhat under spacer structures 116 and/or internal spacers 118; in other embodiments first section 126 may not extend under spacer structures 116 and/or internal spacers 118. To this end, further note that the lateral dimension of second section 128 can vary from one embodiment to the next, based on factors such as the anneal time and the thickness of the nanoribbons to be strained. The longer the anneal time, the farther first section 126 may extend under spacer structures 116 and/or internal spacers 118 (and the smaller the lateral dimension of second section 128 becomes).

According to some embodiments, first section 126 of nanoribbon 104 includes a first concentration of germanium (Ge) while second section 128 at either end of nanoribbon 104 include a second concentration of Ge that is lower than the first concentration of Ge. For example, first section 126 may be silicon germanium (SiGe) with a Ge concentration greater than 20%, greater than 30%, greater than 40%, greater than 50%, greater than 60%, greater than 70%, greater than 80%, or greater than 90%, relative to the Ge concentration second sections 128. Second section 128 at either end of nanoribbon 104 may be SiGe with a Ge concentration of less than 30% or a Ge concentration between about 10% and about 30% (e.g., 20%). According to some other embodiments, first section 126 of nanoribbon 104 includes a first concentration of tin (Sn) while second section 128 at either end of nanoribbon 104 include a second concentration of Sn that is lower than the first concentration of Sn. For example, first section 126 may be germanium tin (GeSn) with a Sn concentration greater than 20%, greater than 30%, greater than 40%, greater than 50%, greater than 60%, greater than 70%, greater than 80%, or greater than 90%, relative to the Ge concentration second sections 128. Second section 128 at either end of nanoribbon 104 may be GeSn with a Sn concentration of less than 30% or a Sn concentration between about 10% and about 30% (e.g., 20%). According to some embodiments, second sections 128 are surrounded by spacer structures 116 and/or internal spacers 118. According to some embodiments, first section 126 having the first Ge or Sn concentration extends through an entire thickness (from top to bottom) of nanoribbon 104 and may extend along an entire length (from left to right) of nanoribbon 104 between second sections 128.

According to some embodiments, the gated portions of the one or more of nanoribbons 104 are thinner than the portions of the one or more of nanoribbons 104 that are under or otherwise protected by spacer structures 116 and/or internal spacers 118. Further note that the gated portions of the one or more of nanoribbons 104 may be thinner compared to other nanoribbons from other structures that do not have the material gradient, such as nanoribbons 106 from second semiconductor device 103. For example, nanoribbons 104 may be between 2 nm and 8 nm thinner (from upper surface to lower surface) compared to nanoribbons 106. In some embodiments, first region 126 of nanoribbon 104 is between about 2 nm and about 8 nm thinner compared to second region 128 of nanoribbon 104.

According to some embodiments, first semiconductor device 101 is a p-channel device having nanoribbons 104 with the Ge or Sn concentration gradient along its length to impart more compressive strain upon nanoribbons 104. Conversely, second semiconductor device 103 may be an n-channel device having nanoribbons 106 without the concentration gradient of Ge or Sn. In this way, p-channel devices of the integrated circuit may be more compressively strained compared to n-channel devices of the integrated circuit.

A conductive contact 130 may be formed over each of source and drain regions 108/110/112 to provide electrical connections to each of source and drain regions 108/110/112. Conductive contact 130 can include any suitable conductive material, such as tungsten, copper, cobalt, titanium, ruthenium, or tantalum. Frontside and backside interconnect structures may also be formed, as will be appreciated.

Fabrication Methodology

FIGS. 2A-2J include cross-sectional views that collectively illustrate an example process for forming an integrated circuit configured with semiconductor devices having intrinsically strained nanoribbons, according to some embodiments. Each figure shows an example structure that results from the process flow up to that point in time, so the depicted structure evolves as the process flow continues, culminating in the structure shown in FIG. 2J, which is similar to the structure shown in FIG. 1A. The illustrated integrated circuit structure may be part of a larger integrated circuit that includes other integrated circuitry not depicted. Example materials and process parameters are given, but the present disclosure is not intended to be limited to any specific such materials or parameters, as will be appreciated.

Figure 2A:
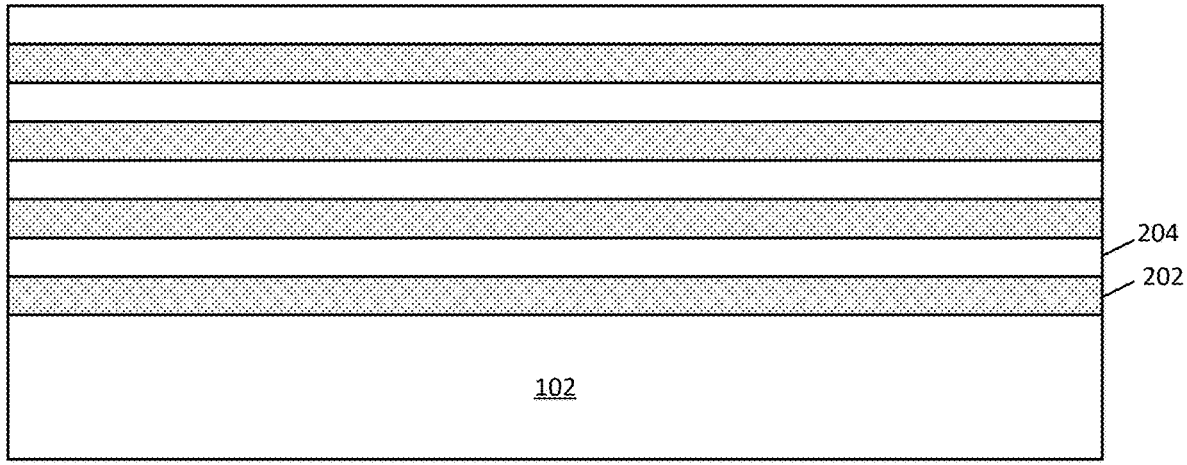
FIGS. 2A-2J are cross-section views that collectively illustrate various stages in an example process for forming a semiconductor device with nanoribbons having an increased strain, in accordance with some embodiments of the present disclosure.

FIG. 2A illustrates substrate 102 having a series of material layers formed over the substrate, according to an embodiment of the present disclosure. Alternating material layers may be deposited over substrate 102 including first layers 202 alternating with second layers 204. Any number of alternating first layers 202 and second layers 204 may be deposited over substrate 102. It should be noted that the cross section illustrated in FIG. 2A is taken along the length of a fin formed from the multiple layers and extending up above the surface of substrate 102.

According to some embodiments, first layers 202 have a different material composition than second layers 204. In some embodiments, first layers 202 are silicon germanium (SiGe) while second layers 204 include a different semiconductor material such as silicon (Si), SiGe, germanium, or III-V materials like indium phosphide (InP) or gallium arsenide (GaAs). In examples where SiGe is used in each of first layers 202 and in second layers 204, the germanium concentration is different between first layers 202 and second layers 204. For example, first layers 202 may include a higher germanium content compared to second layers 204. Either of both of first layers 202 and second layers 204 may be doped with either n-type dopants (to produce a p-channel transistor) or p-type dopants (to produce an n-channel transistor).

While dimensions can vary from one example embodiment to the next, the thickness of each first layer 202 may be between about 5 nm and about 20 nm. In some embodiments, the thickness of each first layer 202 is substantially the same (e.g., within 1-2 nm). The thickness of each of second layers 204 may be about the same as the thickness of each first layer 202 (e.g., about 5-20 nm). Each of first layers 202 and second layers 204 may be deposited using any known material deposition technique, such as chemical vapor deposition (CVD), plasma-enhanced chemical vapor deposition (PECVD), physical vapor deposition (PVD), or atomic layer deposition (ALD).

Figure 2B:
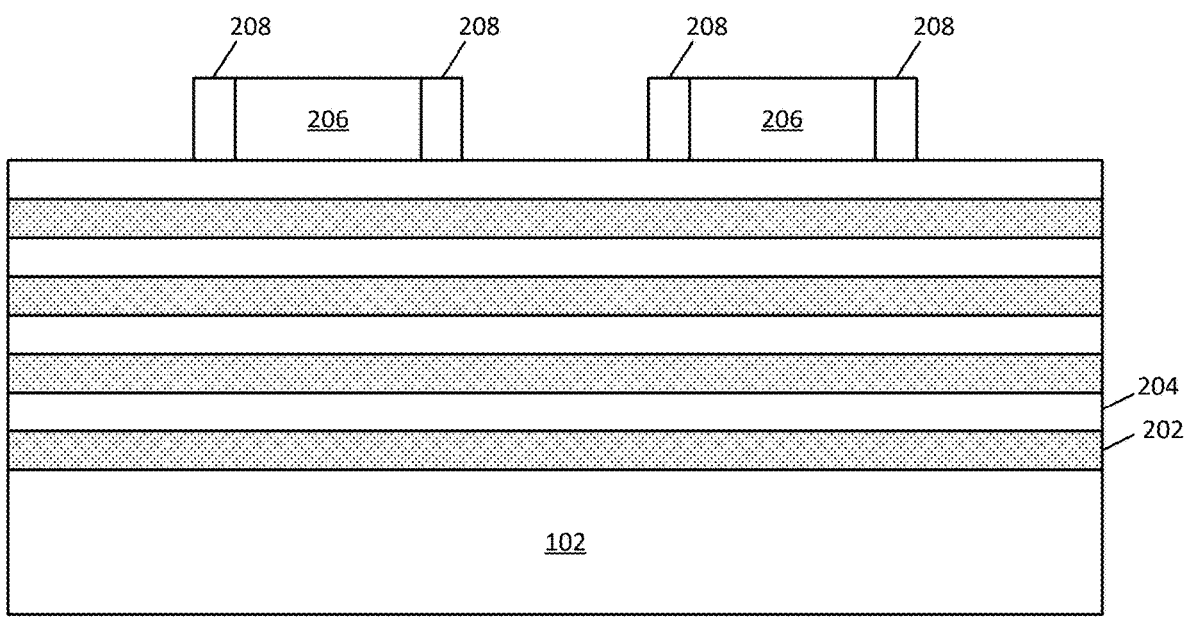

FIG. 2B illustrates a cross-sectional view of the structure shown in FIG. 2A following the formation of sacrificial gate structures 206 and sidewall spacers 208 over the alternating layer structure of the fin, according to an embodiment. Sacrificial gate structures 206 may run in an orthogonal direction to the length of the fin and may include any material that can be safely removed later in the process without etching or otherwise damaging any portions of the fin or of spacer structures 208. In some embodiments, sacrificial gate structures 206 include polysilicon. Spacer structures 208 may be formed using an etch-back process where spacer material is deposited everywhere and then anisotropically etched to leave the material only on sidewalls of structures including sacrificial gate structures 206. Spacer structures 208 may include a dielectric material, such as silicon nitride, silicon oxy-nitride, or any formulation of those layers incorporating carbon or boron dopants. Sacrificial gate structures 206 together with spacer structures 208 define portions of the fin that will be used to form first and second semiconductor devices, as discussed further herein.

Figure 2C:
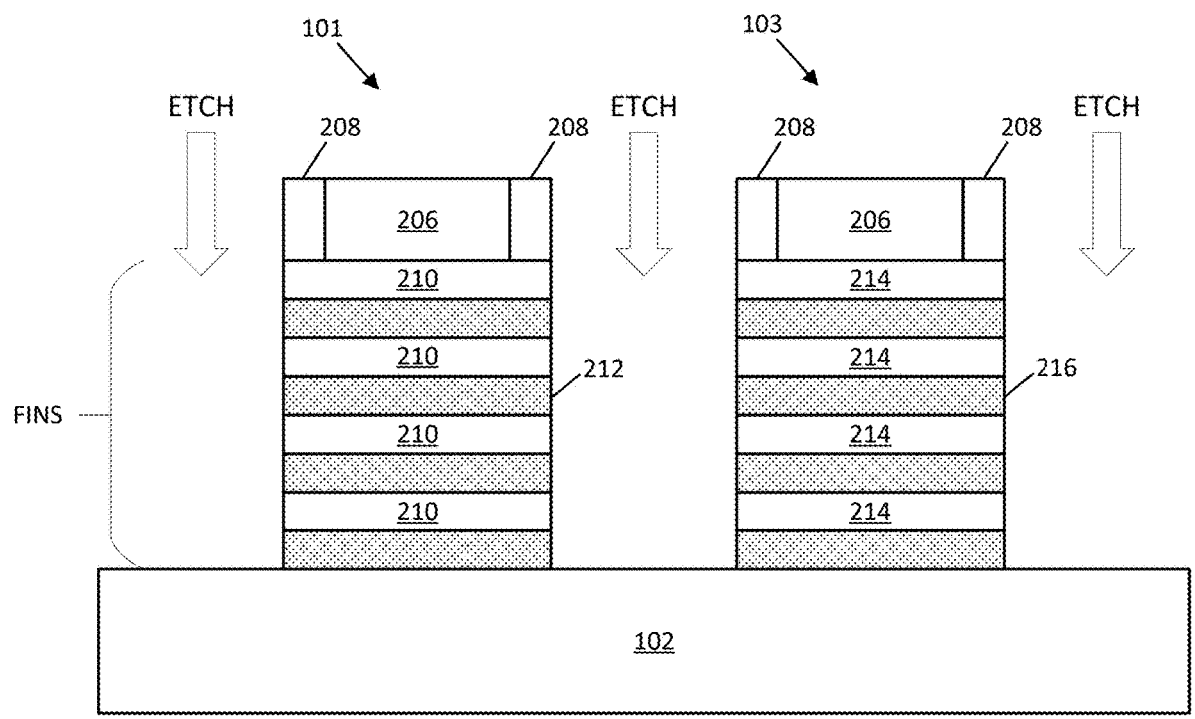

FIG. 2C illustrates a cross-sectional view of the structure shown in FIG. 2B following the removal of the exposed fin not under sacrificial gate structures 206 and sidewall spacers 208, according to an embodiment of the present disclosure. According to some embodiments, the various alternating material layers are etched at substantially the same rate using an anisotropic RIE process. In some embodiments, some undercutting occurs along the edges of the resulting fins beneath spacer structures 208 such that the length of a given fin is not exactly the same as a sum of the widths of spacer structures 208 and a width of sacrificial gate structure 206. The RIE process may also etch into substrate 102 thus recessing portions of substrate 102 on either side of any of the fins. According to some embodiments, a first fin of first semiconductor device 101 includes first layers 210 alternating with second layers 212, while a second fin of second semiconductor device 103 includes third semiconductor layers 214 alternating with fourth semiconductor layers 216. According to some embodiment, first and third layers 210 and 214 have the same material composition and second and fourth layers 212 and 216 have the same material composition.

Figure 2D:
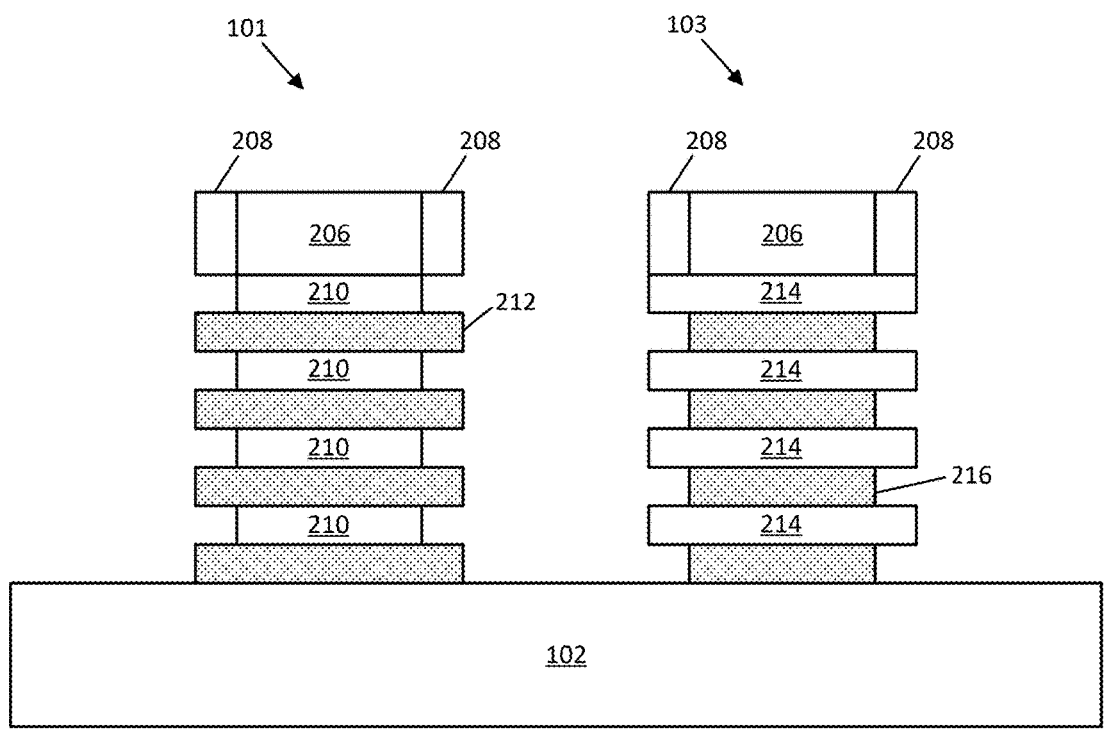

FIG. 2D illustrates a cross-sectional view of the structure shown in FIG. 2C following the removal of portions of first layers 210 from first semiconductor device 101 and portions of fourth layers 216 from second semiconductor device 103, according to an embodiment of the present disclosure. Different isotropic etching processes may be used to remove the layers from the different semiconductor devices. In an example, first layers 210 and third layers 214 are silicon layers, while second layers 212 and fourth layers 216 are silicon germanium layers. Accordingly, a first isotropic etch may be performed to laterally recess the ends of the silicon first layers 210, while etching comparatively little of the silicon germanium second layers 212 in first semiconductor device 101. A second isotropic etch may be performed to laterally recess the ends of the silicon germanium fourth layers 216, while etching comparatively little of the silicon third layers 214 in second semiconductor device 103. Second semiconductor device 103 may be protected during the etching of first layers 210 of first semiconductor device 101, and first semiconductor device 101 may be protected during the etching of fourth layers 216 of second semiconductor device 103.

Figure 2E:
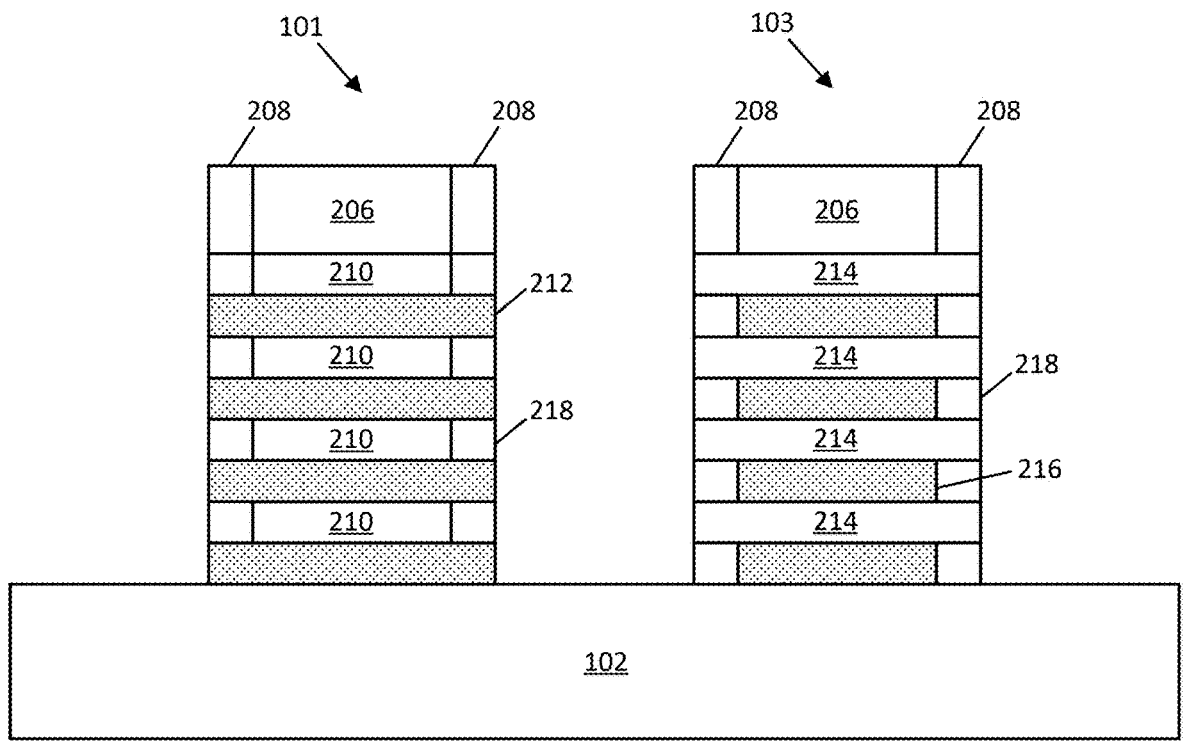
Figure 2E:
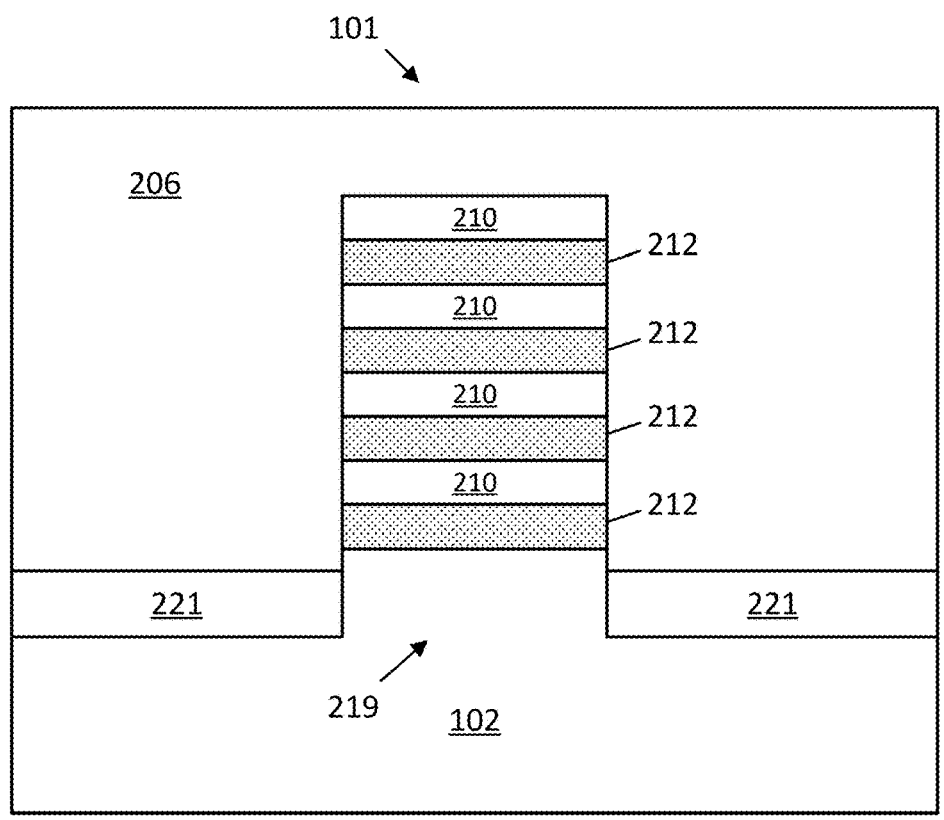

FIG. 2E illustrates a cross-sectional view of the structure shown in FIG. 2D following the formation of internal spacers 218, according to an embodiment of the present disclosure. Internal spacers 218 may have a material composition that is similar to or the exact same as spacer structures 208. Accordingly, internal spacers 218 may be any suitable dielectric material that exhibits high etch selectively to semiconductor materials such as silicon and/or silicon germanium. Internal spacers 218 may be conformally deposited over the sides of the fin structures using a CVD process like ALD and then etched back using an isotropic etching process to expose the ends of second layers 212 of first semiconductor device 101 and the ends of third layers 214 of second semiconductor device 103.

FIG. 2E' illustrates an orthogonal cross-sectional view taken across first semiconductor device 101 during the same fabrication stage as illustrated in FIG. 2E. Sacrificial gate structure 206 surrounds the fin of alternating first layers 210 and second layers 212. The fin also includes a sub fin 219 that may be an integral part of substrate 102 (e.g., formed from substrate 102). A dielectric fill 221 is present on either side of sub fin 219. Dielectric fill 219 may act as shallow trench isolation (STI) structures between first semiconductor device 101 and any neighboring semiconductor devices. Dielectric fill 219 may be any suitable dielectric material, such as, for example, silicon dioxide, aluminum oxide, or silicon oxycarbonitride.

According to some embodiments, a top surface of sub fin 219 is above a top surface of dielectric fill 221. In other words, dielectric fill 221 is recessed below a top surface of sub fin 219 when it is being formed, thus exposing at least a portion of sub fin 219 above dielectric fill 221. A portion of sub fin 219 is exposed to allow for the bottom second layer 212 to be released into a nanoribbon, as discussed in more detail herein.

Figure 2F:
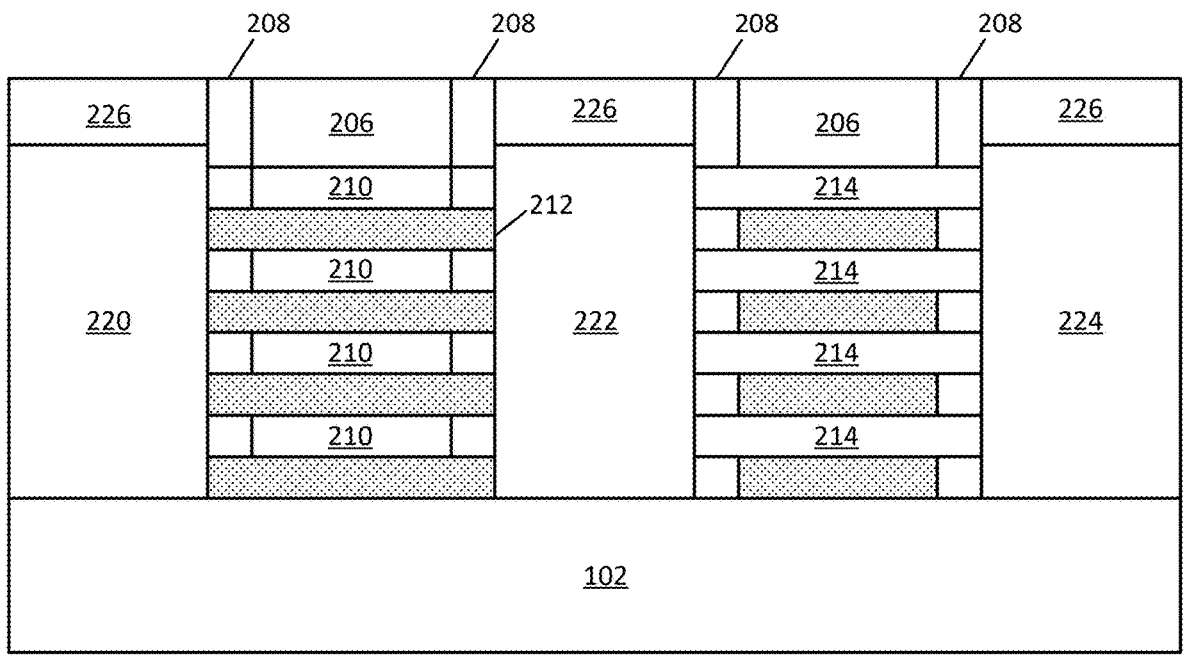

FIG. 2F illustrates a cross-sectional view of the structure shown in FIG. 2E following the formation of source and drain regions, according to an embodiment of the present disclosure. According to an embodiment, a source region 220 is formed at first ends of second layers 212 and a drain region 222 is formed between second ends of second layers 212 and first ends of third layers 214. Another source region 224 may be formed at second ends of third layers 224. As noted above, any of source and drain regions 220/222/224 can act as either a source or drain depending on the application. In some examples, source and drain regions 220/222/224 are epitaxially grown from the ends of second layers 212 and third layers 214. Any semiconductor materials suitable for source and drain regions 220/222/224 can be used (e.g., group IV and group III-V semiconductor materials). Source and drain regions 220/222/224 may include multiple layers such as liners and capping layers to improve contact resistance. In any such cases, the composition and doping of source and drain regions 220/222/224 may be the same or different, depending on the polarity of the transistors. Any number of source and drain configurations and materials can be used.

A dielectric cap layer 226 may be formed over each of source and drain regions 220/222/224, according to some embodiments. Dielectric cap layer 226 allows for a planarized structure, such that the top surface of sacrificial gate structure 206 is co-planar with the top surface of dielectric cap layer 226. Dielectric cap layer 226 may be any suitable dielectric material, such as silicon oxide, aluminum oxide, silicon nitride, or silicon oxycarbonitride.

Figure 2G:
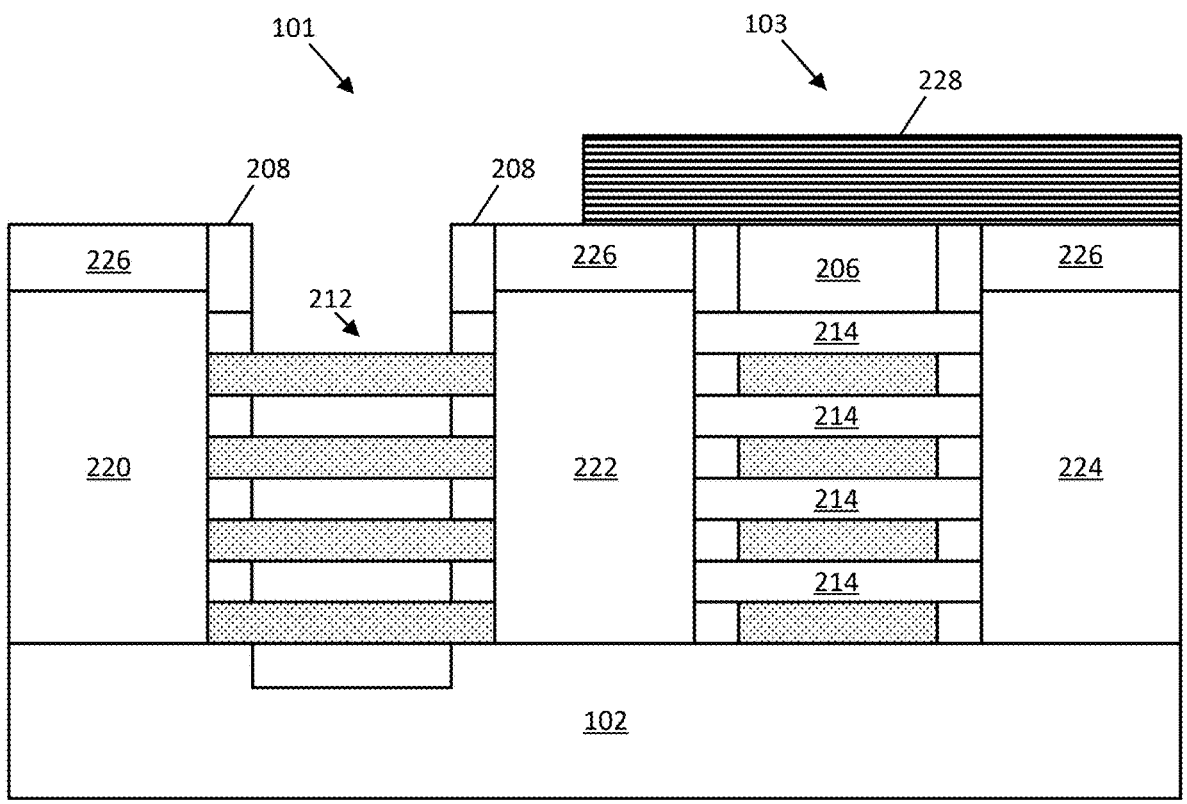
Figure 2G:
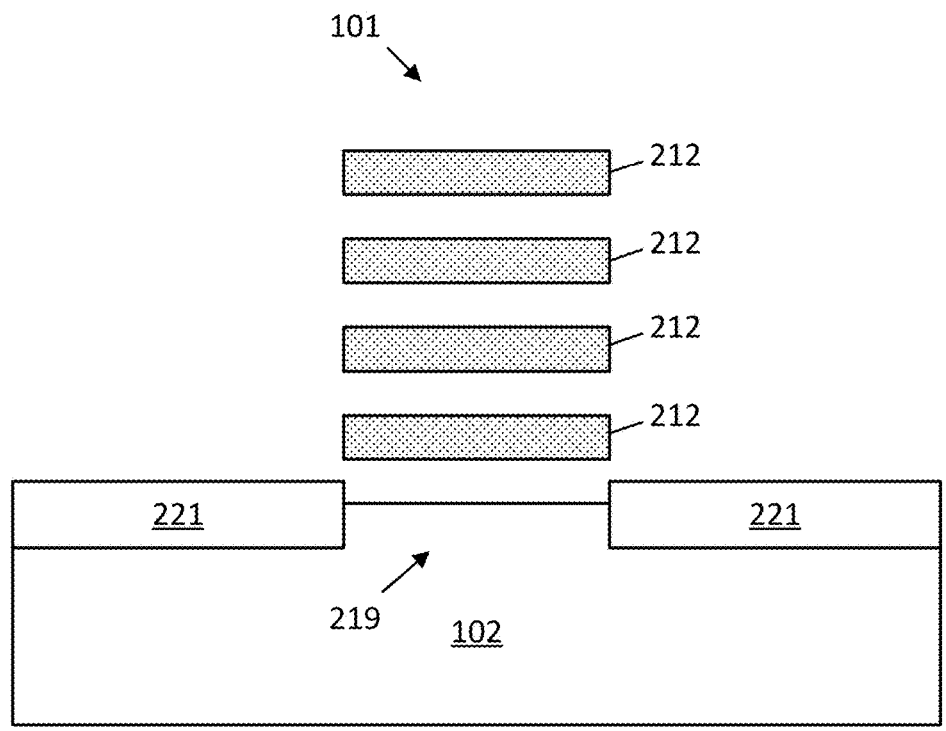

FIG. 2G illustrates a cross-sectional view of the structure shown in FIG. 2F following the removal of the sacrificial gate structure 206 and first layers 210 of first semiconductor device 101, according to an embodiment of the present disclosure. A masking layer 228 may first be patterned over second semiconductor device 103 to protect it from the etching process that removes sacrificial gate structure 206 and first layers 210 from first semiconductor device 101. Masking layer 228 may be a carbon hard mask (CHM) or any other type of photoresist. It should be understood that masking layer 228 may be patterned to protect any number of semiconductor devices while leaving any number of other semiconductor devices exposed. In some embodiments, masking layer 228 is patterned to protect one or more n-channel devices while leaving one or more other p-channel devices exposed.

The exposed sacrificial gate structure 206 may be removed using any wet or dry isotropic process thus exposing the alternating layer stack of the fin within the trench left behind after the removal of sacrificial gate structure 206. Once sacrificial gate structure 206 has been removed, the exposed first layers 210 may also be removed using a selective isotropic etching process that removes the material of first layers 210 but does not remove (or removes very little of) second layers 212. In one example, first layers 210 are silicon layers that are removed using an isotropic silicon etchant gas while second layers 212 are silicon germanium (SiGe) or germanium tin (GeSn). At this point, the suspended second layers 212 form nanoribbons or nanowires that extend between source and drain regions 220/222. According to some embodiments, releasing second layers 212 includes releasing the bottom-most second layer 212, which involves removing a portion of the sub fin beneath the alternating layer stack. FIG. 2G' illustrates an orthogonal cross-sectional view taken across first semiconductor device 101 during the same fabrication stage as illustrated in FIG. 2G. Since at least a portion of sub fin 219 was exposed above the top surface of dielectric fill 221, an isotropic etching process can be used to remove a top portion of sub fin 219, thus releasing the bottom second layer 212. In some embodiments, the same isotropic etching process used to remove first layers 210 is also used to remove the top portion of sub fin 219 (e.g., first layers 210 and sub fin 219 comprise substantially the same material).

Figure 2H:
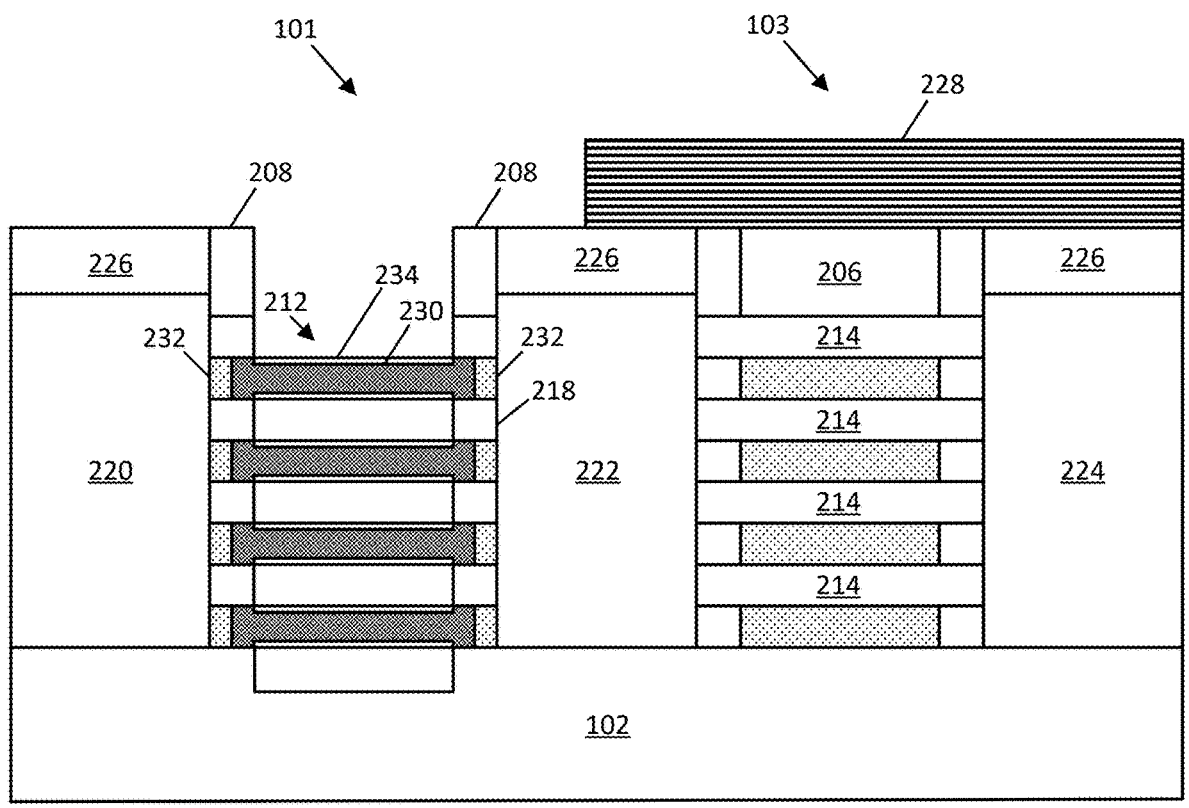

FIG. 2H illustrates a cross-sectional view of the structure shown in FIG. 2G following an anneal process to drive either Ge (in the case of SiGe layers) or Sn (in the case of GeSn layers) within second layers 212 inwards thus enriching second layers 212 with a higher concentration of either Ge or Sn, according to an embodiment of the present disclosure. Second semiconductor layers 212 may be annealed at a temperature between about 800° C. and 1000° C. for between 1 millisecond and 10 milliseconds, between 1 millisecond and 3 milliseconds, or less than 5 milliseconds. Higher Ge concentrations within second layers 212 may use lower annealing temperature (e.g., less than 850 C) to sufficiently drive the Ge deeper into second layers 212. By driving either the Ge or Sn into second layers 212, a first region 230 of a given nanoribbon of second layers 212 includes a first Ge or Sn concentration throughout a thickness of the entire first region 230, according to some embodiments. Since the anneal process may not be able to drive the Ge or Sn laterally to the ends of second layers 212, the given nanoribbon of second layers 212 includes second regions 232 at either end of the given nanoribbon that have a second Ge or Sn concentration that is lower than the first Ge or Sn concentration of first region 230. In some embodiments, the Ge or Sn concentration of second regions 232 is substantially the same (e.g., within 5% of each other) as the Ge or Sn concentration from the second layers 212 before the annealing process. Second regions 232 may contact corresponding source and drain regions 220 and 222 and may be surrounded by spacer structures 208 and/or internal spacers 218. Second regions 232 may also be referred to as a second region at one end of the given nanoribbon and a separate third region at the opposite end of the given nanoribbon. The previous relevant discussion with respect to how far first region 230 (similar to first section 126) extends under spacer structures 208 and internal spacers 218 is equally applicable here (e.g., the longer the anneal time, the farther first region 230 will extend under the spacer structures 208 and internal spacers 218, and the smaller the lateral thickness of the second regions 232 from left to right becomes.

In one example, first region 230 of a given nanoribbon of first semiconductor layers 212 includes silicon and a first concentration of germanium, such as between 20% and 30% Ge, between 30% and 40% Ge, between 40% and 50% Ge, between 50% and 60% Ge, between 60% and 70% Ge, between 70% and 80% Ge, between 80% and 90% Ge, between 90% and 100% Ge, or between 40% and 80% Ge. Additionally, second regions 232 include silicon and a second concentration of germanium that is lower than the first concentration of germanium. For example, second regions 232 may have a Ge concentration between 10% and 40% Ge, or between 20% and 30% Ge. In another example, first region 230 of a given nanoribbon of first semiconductor layers 212 includes germanium and a first concentration of tin, such as between 20% and 30% Sn, between 30% and 40% Sn, between 40% and 50% Sn, between 50% and 60% Sn, between 60% and 70% Sn, between 70% and 80% Sn, between 80% and 90% Sn, between 90% and 100% Sn, or between 40% and 80% Sn. Additionally, second regions 232 include germanium and a second concentration of tin that is lower than the first concentration of tin. For example, second regions 232 may have a Sn concentration between 10% and 40% Sn, or between 20% and 30% Sn. Other material combinations are possible as well.

According to some embodiments, the annealing process is performed in an oxygen-rich environment, which causes a thin oxide layer 234 to form around second layers 212. Oxide layer 234 consumes some portion of second layers 212 when it is formed, thus reducing the effective thickness (e.g., the semiconductor portion) of second layers 212.

According to some embodiments, oxide layer 234 is removed prior to the formation of a gate structure using any isotropic etch process. Since a portion of the semiconductor material of second layers 212 is consumed to form oxide layer 234, removal of oxide layer 234 results in thinner second layers 212 compared to third layers 214 of second semiconductor device 103. In some embodiments, second layers 212 are thinned by between 2 nm and 8 nm compared to third layers 214. Additionally, since oxide layer 234 only forms over the exposed portion of second layers 212 between spacer structures 208 and/or internal spacers 218, first region 230 of second layers 212 may be thinned compared to second regions 232 of second layers 212. In other embodiments, oxide layer 234 is left intact and becomes part of the gate dielectric of the gate structure, such as the case where a high-k material is subsequently deposited (e.g., by ALD) on oxide layer 234 for a high-k gate configuration.

Figure 2I:
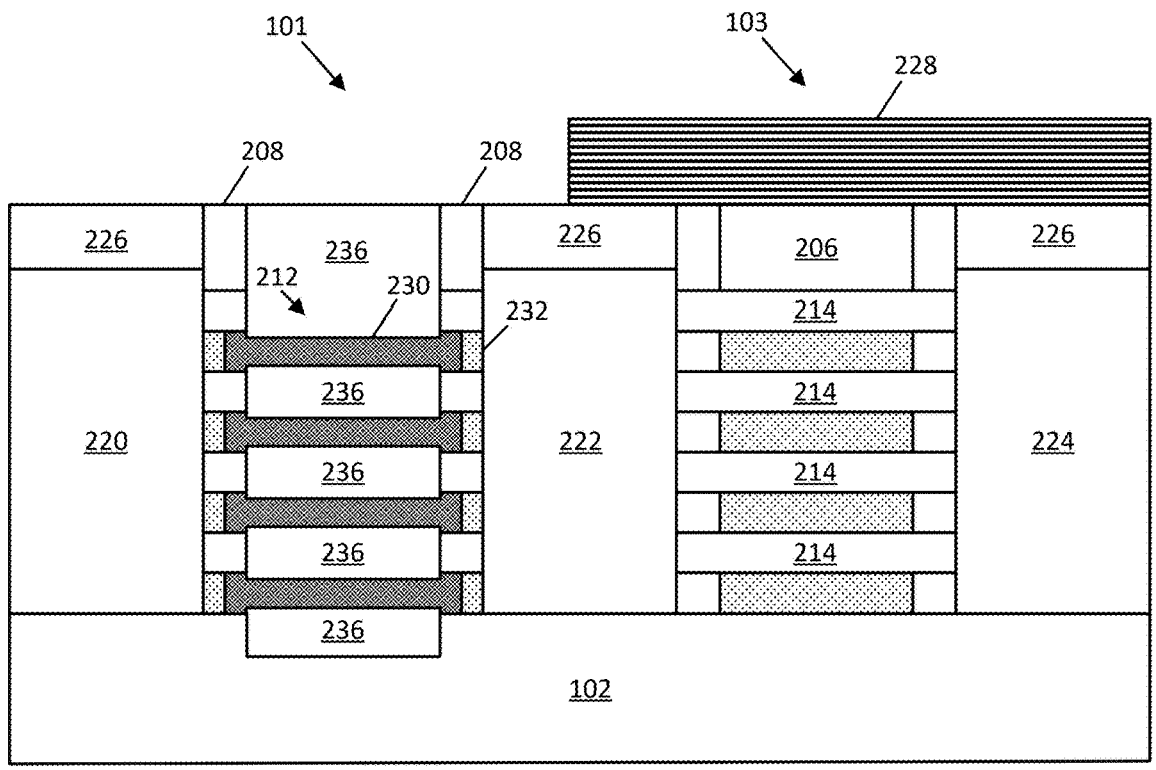

FIG. 2I illustrates a cross-sectional view of the structure shown in FIG. 2H following the formation of a first gate structure 236 around the suspended second layers 212, according to an embodiment of the present disclosure. As noted above, first gate structure 236 includes a gate dielectric and a gate electrode. Note how first gate structure 236 can wrap around second layers 212 in some configurations (e.g., nanoribbons) or can be on multiple sides of second layers 212 in other configurations (e.g., forksheet).

The gate dielectric may be conformally deposited around second layers 212 using any suitable deposition process, such as ALD. The gate dielectric may include any suitable dielectric (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, the gate dielectric is hafnium oxide with a thickness between about 1 nm and about 5 nm. In some embodiments, the gate dielectric may include one or more silicates (e.g., titanium silicate, tungsten silicate, niobium silicate, and silicates of other transition metals). The gate dielectric may be a multilayer structure, in some examples. For instance, the gate dielectric may include a first layer on second layers 212, and a second layer on the first layer. The first layer can be, for instance, an oxide of the semiconductor layers (e.g., silicon dioxide) and the second layer can be a high-k dielectric material (e.g., hafnium oxide). In some embodiments, an annealing process may be carried out on the gate dielectric to improve its quality when a high-k dielectric material is used. In some embodiments, the high-K material can be nitridized to improve its aging resistance.

The gate electrode may be deposited over the gate dielectric and can be any standard or proprietary gate structure that may include any number of gate cuts. In some embodiments, the gate electrode includes doped polysilicon, a metal, or a metal alloy. Example suitable metals or metal alloys include aluminum, tungsten, cobalt, molybdenum, ruthenium, titanium, tantalum, copper, and carbides and nitrides thereof. The gate electrode may include, for instance, one or more work-function layers, resistance-reducing layers, and/or barrier layers. In one example, first semiconductor device 101 is a PMOS device and the work-function layers include, for example, p-type work-function materials (e.g., titanium nitride). In the case of an NMOS device, n-type work-function materials can include titanium aluminum carbide.

Figure 2J:
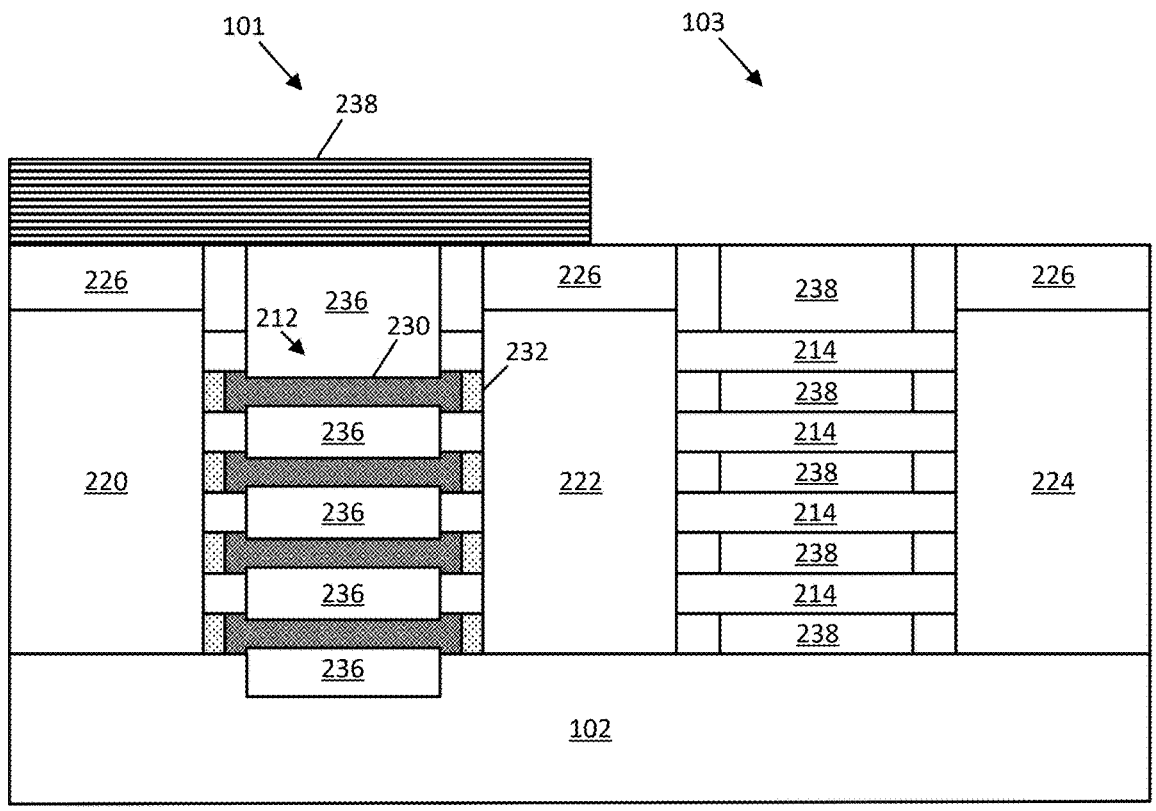

FIG. 2J depicts the cross-section view of the structure shown in FIG. 2I following the completion of the second semiconductor device 103, according to an embodiment of the present disclosure. Another masking layer 238 is formed to protect first semiconductor device 101 while exposing second semiconductor device 103. According to some embodiments, masking layer 238 may be used to protect any number of semiconductor devices that have already had their gate structures formed. Furthermore, any number of semiconductor devices may be exposed, such as second semiconductor device 103. A similar process to that described above for first semiconductor device 101 is then performed to remove sacrificial gate structure 206 and fourth layers 216 to yield suspended third layers 214 that act as nanoribbons extending between drain region 220 and source region 224. As noted above, since the removed first layers 210 from first semiconductor device 101 where different material layers at different heights than the removed fourth layers 216 from second semiconductor device 103, the nanoribbons (e.g., second layers 212) of first semiconductor device 101 are at different staggered heights than the nanoribbons (e.g., third layers 214) of second semiconductor device 103.

A second gate structure 238 is formed around the suspended third layers 214, according to an embodiment of the present disclosure. Like first gate structure 236, second gate structure 238 includes a gate dielectric and a gate electrode. According to some embodiments, second semiconductor device 103 is an n-channel device and thus second gate structure 238 includes one or more n-type work-function layers.

According to some embodiments, first semiconductor device 101 is representative of one or more p-channel devices in the integrated circuit and second semiconductor device 103 is representative of one or more n-channel devices in the integrated circuit. Second layers 212 of first semiconductor device 101 are thinner compared to third layers 214 of second semiconductor device 103, such as around 2 nm to 8 nm thinner, according to some embodiments. The material composition of second layers 212 is different from third layers 214 owing to the removal of different material layers from each of the fins and the subsequent annealing process. For example, second layers 212 include first region 230 having silicon and a first concentration of germanium and second regions 232 having silicon and a second concentration of germanium that is lower than the first concentration of germanium, while third layers 214 may include silicon and substantially no germanium (e.g., less than 1% germanium). In another example, second layers 212 include first region 230 having germanium and a first concentration of tin and second regions 232 having germanium and a second concentration of tin that is lower than the first concentration of tin, while third layers 214 may include silicon or germanium and substantially no tin (e.g., less than 1% tin). The material gradient of either Ge or Sn within second layers 212 causes additional compressive stress within second layers 212 as compared to third layers 214.

Figure 3:
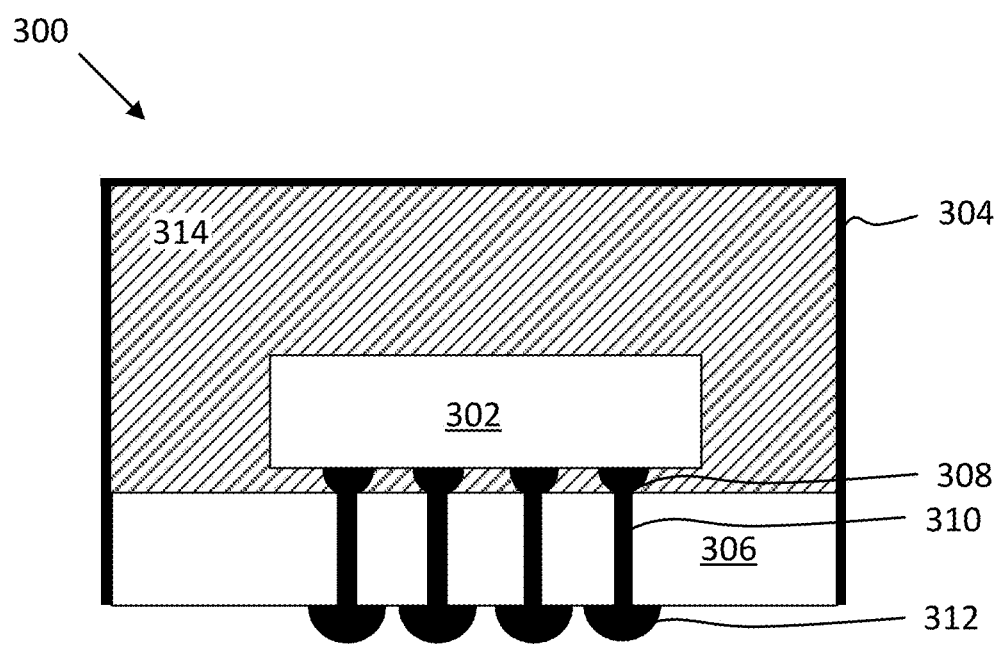
FIG. 3 illustrates a cross-section view of a chip package containing one or more semiconductor dies, in accordance with some embodiments of the present disclosure.

FIG. 3 illustrates an example embodiment of a chip package 300, in accordance with an embodiment of the present disclosure. As can be seen, chip package 300 includes one or more dies 302. One or more dies 302 may include at least one integrated circuit having semiconductor devices, such as any of the semiconductor devices disclosed herein. One or more dies 302 may include any other circuitry used to interface with other devices formed on the dies, or other devices connected to chip package 300, in some example configurations.

As can be further seen, chip package 300 includes a housing 304 that is bonded to a package substrate 306. The housing 304 may be any standard or proprietary housing, and may provide, for example, electromagnetic shielding and environmental protection for the components of chip package 300. The one or more dies 302 may be conductively coupled to a package substrate 306 using connections 308, which may be implemented with any number of standard or proprietary connection mechanisms, such as solder bumps, ball grid array (BGA), pins, or wire bonds, to name a few examples. Package substrate 306 may be any standard or proprietary package substrate, but in some cases includes a dielectric material having conductive pathways (e.g., including conductive vias and lines) extending through the dielectric material between the faces of package substrate 306, or between different locations on each face. In some embodiments, package substrate 306 may have a thickness less than 1 millimeter (e.g., between 0.1 millimeters and 0.5 millimeters), although any number of package geometries can be used. Additional conductive contacts 312 may be disposed at an opposite face of package substrate 306 for conductively contacting, for instance, a printed circuit board (PCB). One or more vias 310 extend through a thickness of package substrate 306 to provide conductive pathways between one or more of connections 308 to one or more of contacts 312. Vias 310 are illustrated as single straight columns through package substrate 306 for ease of illustration, although other configurations can be used (e.g., damascene, dual damascene, through-silicon via, or an interconnect structure that meanders through the thickness of substrate 306 to contact one or more intermediate locations therein). In still other embodiments, vias 310 are fabricated by multiple smaller stacked vias, or are staggered at different locations across package substrate 306. In the illustrated embodiment, contacts 312 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 312, to inhibit shorting.

In some embodiments, a mold material 314 may be disposed around the one or more dies 302 included within housing 304 (e.g., between dies 302 and package substrate 306 as an underfill material, as well as between dies 302 and housing 304 as an overfill material). Although the dimensions and qualities of the mold material 314 can vary from one embodiment to the next, in some embodiments, a thickness of mold material 314 is less than 1 millimeter. Example materials that may be used for mold material 314 include epoxy mold materials, as suitable. In some cases, the mold material 314 is thermally conductive, in addition to being electrically insulating.

Methodology

Figure 4:
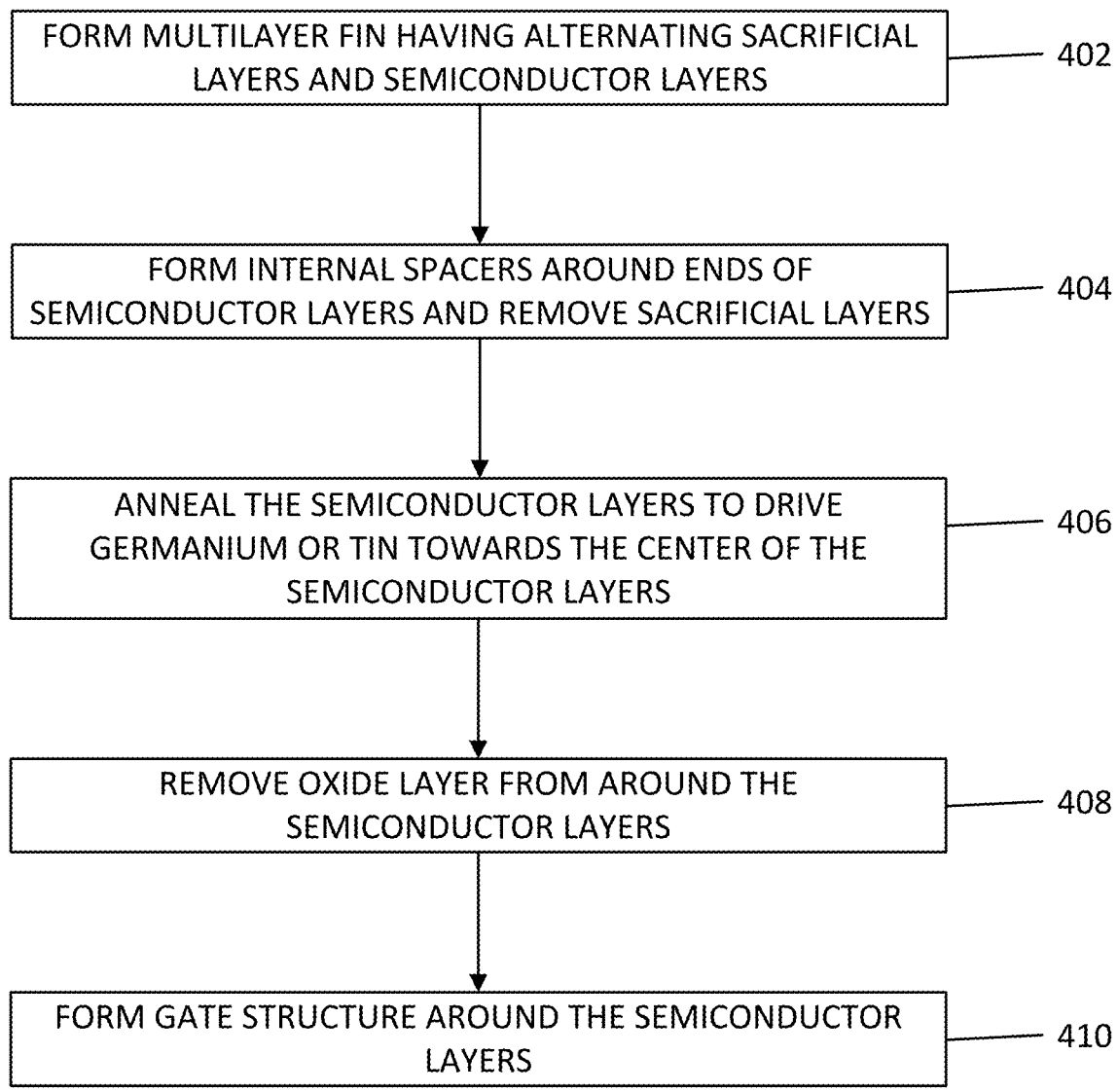
FIG. 4 is a flowchart of a fabrication process for semiconductor devices having nanoribbons with an increased strain, in accordance with an embodiment of the present disclosure.

FIG. 4 is a flow chart of a method 400 for forming at least a portion of an integrated circuit, according to an embodiment. Various operations of method 400 may be illustrated in FIGS. 2A-2J. However, the correlation of the various operations of method 400 to the specific components illustrated in the aforementioned figures is not intended to imply any structural and/or use limitations. Rather, the aforementioned figures provide one example embodiment of method 400. Other operations may be performed before, during, or after any of the operations of method 400. Some of the operations of method 400 may be performed in a different order than the illustrated order.

Method 400 begins with operation 402 where a multilayer fin is formed having alternating semiconductor and sacrificial layers. The sacrificial layers may include Si while the semiconductor layers may be SiGe or GeSn, to name a few examples. The germanium concentration of the SiGe semiconductor layers or the tin concentration of the GeSn semiconductor layers may be between 10% and 40% or between 20% and 30%. The thickness of each of the sacrificial and semiconductor layers may be between about 5 nm and about 20 nm or between about 5 nm and about 10 nm. Each of the sacrificial and semiconductor layers may be deposited using any known material deposition technique, such as CVD, PECVD, PVD, or ALD. The fin of alternating material layers may be defined by patterning a sacrificial gate and spacer structures that extend orthogonally over the fin, then etching around the sacrificial gate and spacer structures via an anisotropic etching process, such as RIE.

Method 400 continues with operation 404 where internal spacers are formed around the ends of the semiconductor layers and the sacrificial layers and sacrificial gate are both removed. The internal spacers may have a material composition that is similar to or the exact same as the spacer structures on either side of the sacrificial gate. Accordingly, the internal spacers may be any suitable dielectric material that exhibits high etch selectivity to semiconductor materials such as silicon and/or silicon germanium. The sacrificial layers may first be laterally etched back while the internal spacers fill the recesses between the semiconductor layers. The internal spacers may be conformally deposited over the sides of the fin structure using a CVD process like ALD and then etched back using an isotropic etching process to expose the ends of the semiconductor layers.

Once the internal spacers have been formed, the sacrificial gate and sacrificial layers may be removed from the fin, leaving behind suspended semiconductor layers (e.g., nanoribbons) that extend between a source and drain region (also formed following the formation of the internal spacers). One or more isotropic etching procedures may be performed to remove the sacrificial gate and sacrificial layers.

Method 400 continues with operation 406 where the suspended semiconductor layers are annealed to drive the Ge or Sn inwards thus increasing the concentration of Ge or Sn in the semiconductor layers suspended between the spacer structures and/or internal spacers. According to some embodiments, the Ge or Sn from around the surface of the semiconductor layers is driven inwards, thus forming a region that extends along the length of the semiconductor layers and throughout its thickness that includes a first Ge or Sn concentration. The ends of the semiconductor layers may be far enough away from the formed material layer that the Ge or Sn does not diffuse far enough to reach them, thus leaving the ends as having a second Ge or Sn concentration that is lower than the first Ge or Sn concentration. The second Ge or Sn concentration may be substantially similar to the original Ge or Sn concentration of the semiconductor layers prior to the annealing.

The semiconductor layers may be annealed at a temperature between about 800° C. and 1000° C. for between 1 millisecond and 10 milliseconds, between 1 millisecond and 3 milliseconds, or less than 5 milliseconds. According to some embodiments, the annealing is performed in an oxygen-rich environment, which causes a thin oxide to form around the outside surface of the semiconductor layers. The oxide layer may have a thickness between about 1 nm and about 5 nm.

Method 400 continues with operation 408 where the oxide layer is removed from around the semiconductor layers. An isotropic etching process may be used to remove the oxide layer to ensure a clean surface of the semiconductor layers for the formation of the gate dielectric. Since a portion of the semiconductor material of the semiconductor layers is consumed to form the oxide layer, removal of the oxide layer results in a thinner portion of the semiconductor layers compared to another portion of the semiconductor layers beneath the spacer structures and/or the internal spacers. In some embodiments, the semiconductor layers are thinned on all sides by between 1 nm and 5 nm from their original size.

Method 400 continues with operation 410 where a gate structure is formed around the semiconductor layers. As discussed above, the gate structure includes both a gate dielectric and a gate electrode formed over the gate dielectric. In the case of a strained p-channel device, the gate electrode may include one or more p-type work-function metals.

Example System

Figure 5:
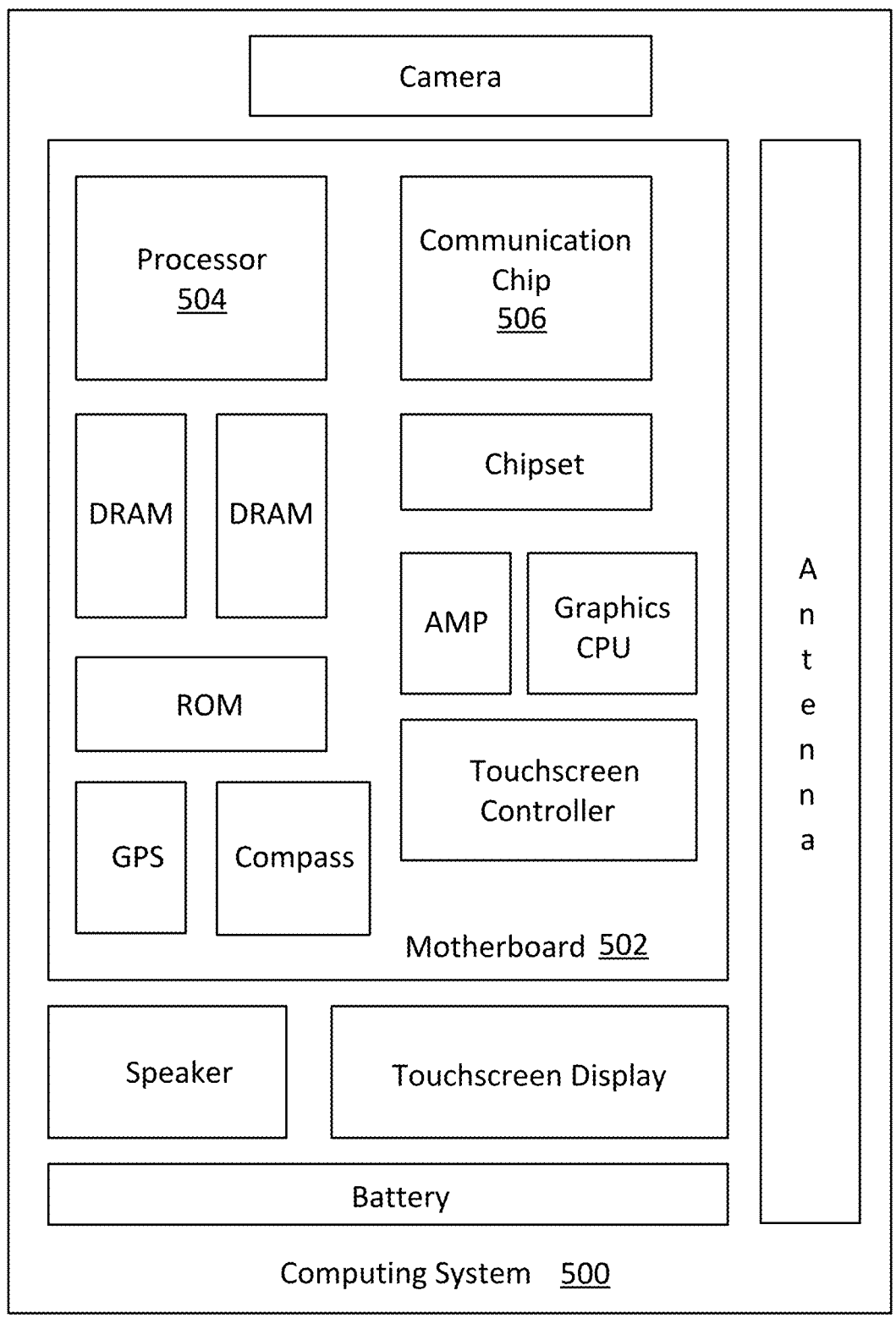
FIG. 5 illustrates a computing system including one or more integrated circuits, as variously described herein, in accordance with an embodiment of the present disclosure.

FIG. 5 is an example computing system implemented with one or more of the integrated circuit structures as disclosed herein, in accordance with some embodiments of the present disclosure. As can be seen, the computing system 500 houses a motherboard 502. The motherboard 502 may include a number of components, including, but not limited to, a processor 504 and at least one communication chip 506, each of which can be physically and electrically coupled to the motherboard 502, or otherwise integrated therein. As will be appreciated, the motherboard 502 may be, for example, any printed circuit board (PCB), whether a main board, a daughterboard mounted on a main board, or the only board of system 500, etc.

Depending on its applications, computing system 500 may include one or more other components that may or may not be physically and electrically coupled to the motherboard 502. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 500 may include one or more integrated circuit structures or devices configured in accordance with an example embodiment (e.g., a module including an integrated circuit on a substrate, the substrate having a semiconductor device with intrinsic compressive strain and a channel region having a mid-portion with higher Ge or Sn concentrations compared to end portions and any subfin portion, if present, as variously provided herein). In some embodiments, multiple functions can be integrated into one or more chips (e.g., for instance, note that the communication chip 506 can be part of or otherwise integrated into the processor 504).

The communication chip 506 enables wireless communications for the transfer of data to and from the computing system 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing system 500 includes an integrated circuit die packaged within the processor 504. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 506 also may include an integrated circuit die packaged within the communication chip 506. In accordance with some such example embodiments, the integrated circuit die of the communication chip includes one or more semiconductor devices as variously described herein. As will be appreciated in light of this disclosure, note that multi-standard wireless capability may be integrated directly into the processor 504 (e.g., where functionality of any chips 506 is integrated into processor 504, rather than having separate communication chips). Further note that processor 504 may be a chip set having such wireless capability. In short, any number of processor 504 and/or communication chips 506 can be used. Likewise, any one chip or chip set can have multiple functions integrated therein.

In various implementations, the computing system 500 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 500 may be combined or integrated in a system-on-a-chip (SoC) architecture. In some embodiments, the components may be hardware components, firmware components, software components or any suitable combination of hardware, firmware or software.

Further Example Embodiments

The following examples pertain to further embodiments, from which numerous permutations and configurations will be apparent.

Example 1 is an integrated circuit that includes a semiconductor device having one or more semiconductor nanoribbons extending between a source region and a drain region, a first spacer structure around first ends of the one or more semiconductor nanoribbons, a second spacer structure around second ends of the one or more semiconductor nanoribbons; and a gate structure around the one or more semiconductor nanoribbons and between the first and second spacer structures. At least one nanoribbon of the one or more semiconductor nanoribbons includes a first region at one end of the nanoribbon having a first germanium (Ge) concentration, a second region at the other end of the nanoribbon having a second Ge concentration, and a third region between the first and second regions. The third region has a third Ge concentration greater than each of the first and second Ge concentrations.

Example 2 includes the subject matter of Example 1, wherein the at least one nanoribbon comprises germanium and silicon.

Example 3 includes the subject matter of Example 2, wherein each of the first, second, and third regions comprises germanium and silicon.

Example 4 includes the subject matter of any one of Examples 1-3, wherein the third region extends along an entire length of the at least one nanoribbon between the first and second regions.

Example 5 includes the subject matter of any one of Examples 1-4, wherein an entirety of the third region has the third Ge concentration and the third region extends through an entire thickness of the nanoribbon.

Example 6 includes the subject matter of any one of Examples 1-5, wherein each of the first and second Ge concentrations is between about 10% and about 40% Ge, and the third Ge concentration is between about 40% and about 80% Ge.

Example 7 includes the subject matter of any one of Examples 1-6, wherein the first Ge concentration is within 5% of the second Ge concentration, and the third Ge concentration is at least 10% greater than each of the first and second Ge concentrations.

Example 8 includes the subject matter of any one of Examples 1-7, wherein the first spacer structure is around the first region of the at least one nanoribbon and the second spacer structure is around the second region of the at least one nanoribbon.

Example 9 includes the subject matter of any one of Examples 1-8, wherein a thickness of the third region of the at least one nanoribbon is less than a thickness of either the first or second regions of the at least one nanoribbon.

Example 10 includes the subject matter of any one of Examples 1-9, wherein the semiconductor device is a first semiconductor device having one or more first semiconductor nanoribbons, and the integrated circuit further comprises a second semiconductor device having one or more second semiconductor nanoribbons, wherein the one or more first semiconductor nanoribbons are not co-planar with the one or more second semiconductor nanoribbons.

Example 11 includes the subject matter of Example 10, wherein the first semiconductor device is a p-channel device and the second semiconductor device is an n-channel device.

Example 12 is a printed circuit board comprising the integrated circuit of any one of Examples 1-11.

Example 13 is an electronic device having a chip package with one or more dies. At least one of the one or more dies includes a semiconductor device having one or more semiconductor nanoribbons extending between a source region and a drain region, a first spacer structure around first ends of the one or more semiconductor nanoribbons, a second spacer structure around second ends of the one or more semiconductor nanoribbons; and a gate structure around the one or more semiconductor nanoribbons and between the first and second spacer structures. At least one nanoribbon of the one or more semiconductor nanoribbons includes a first region at one end of the nanoribbon having a first germanium (Ge) concentration, a second region at the other end of the nanoribbon having a second Ge concentration, and a third region between the first and second regions. The third region has a third Ge concentration greater than each of the first and second Ge concentrations.

Example 14 includes the subject matter of Example 13, wherein the at least one nanoribbon comprises germanium and silicon.

Example 15 includes the subject matter of Example 14, wherein each of the first, second, and third regions comprises germanium and silicon.

Example 16 includes the subject matter of any one of Examples 13-15, wherein the third region extends along an entire length of the at least one nanoribbon between the first and second regions.

Example 17 includes the subject matter of any one of Examples 13-16, wherein an entirety of the third region has the second Ge concentration and the third region extends through an entire thickness of the nanoribbon.

Example 18 includes the subject matter of any one of Examples 13-17, wherein each of the first and second Ge concentrations is between about 10% and about 40% Ge, and the third Ge concentration is between about 40% and about 80% Ge.

Example 19 includes the subject matter of any one of Examples 13-18, wherein the first Ge concentration is within 5% of the second Ge concentration, and the third Ge concentration is at least 10% greater than each of the first and second Ge concentrations.

Example 20 includes the subject matter of any one of Examples 13-19, wherein the first spacer structure is around the first region of the at least one nanoribbon and the second spacer structure is around the second region of the at least one nanoribbon.

Example 21 includes the subject matter of any one of Examples 13-20, wherein a thickness of the third region of the at least one nanoribbon is less than a thickness of either the first or second regions of the at least one nanoribbon.

Example 22 includes the subject matter of any one of Examples 13-21, further comprising a printed circuit board, wherein the chip package is attached to the printed circuit board.

Example 23 includes the subject matter of any one of Examples 13-22, wherein the semiconductor device is a first semiconductor device having one or more first semiconductor nanoribbons, and the at least one of the one or more dies further comprises a second semiconductor device having one or more second semiconductor nanoribbons, wherein the one or more first semiconductor nanoribbons are not co-planar with the one or more second semiconductor nanoribbons.

Example 24 includes the subject matter of Example 23, wherein the first semiconductor device is a p-channel device and the second semiconductor device is an n-channel device.

Example 25 is a method of forming an integrated circuit. The method includes forming a multilayer fin having first material layers alternating with second material layers, the second material layers comprising silicon (Si) and germanium (Ge); forming sidewall spacer structures around exposed ends of the second material layers; removing the first material layers to form suspended second material layers; annealing the suspended second material layers to drive the Ge towards a center of each of the second material layers between the sidewall spacer structures; and removing an oxide layer from around the suspended second material layers.

Example 26 includes the subject matter of Example 25, wherein the first material layers comprise Si.

Example 27 includes the subject matter of Example 25 or 26, wherein the second material layers comprise a Ge concentration between about 10% and about 40% along an entire length of the second material layers prior to the annealing.

Example 28 includes the subject matter of Example 27, wherein a portion of the suspended second material layers between the sidewall structures comprises a Ge concentration between about 40% and about 80% after the annealing.

Example 29 includes the subject matter of any one of Examples 25-28, wherein the oxide layer is formed around the suspended second material layers during the annealing.

Example 30 includes the subject matter of any one of Examples 25-29, wherein annealing the suspended second material layers comprises annealing at a temperature between 800 C and 1000 C for between 1-3 milliseconds.

Example 31 is an integrated circuit that includes a semiconductor device having one or more semiconductor nanoribbons extending between a source region and a drain region, a first spacer structure around first ends of the one or more semiconductor nanoribbons, a second spacer structure around second ends of the one or more semiconductor nanoribbons; and a gate structure around the one or more semiconductor nanoribbons and between the first and second spacer structures. At least one nanoribbon of the plurality of semiconductor nanoribbons includes a first region at one end of the nanoribbon having a first tin (Sn) concentration, a second region at the other end of the nanoribbon having a second Sn concentration, and a third region between the first and second regions. The third region has a third Sn concentration greater than each of the first and second Sn concentrations.

Example 32 includes the subject matter of Example 31, wherein the at least one nanoribbon comprises germanium and tin.

Example 33 includes the subject matter of Example 31 or 32, wherein the third region extends along an entire length of the at least one nanoribbon between the first and second regions.

Example 34 includes the subject matter of any one of Examples 31-33, wherein an entirety of the third region has the second Sn concentration and the third region extends through an entire thickness of the nanoribbon.

Example 35 includes the subject matter of any one of Examples 31-34, wherein the semiconductor device is a first semiconductor device having one or more first semiconductor nanoribbons, and the integrated circuit further comprises a second semiconductor device having one or more second semiconductor nanoribbons, wherein the one or more first semiconductor nanoribbons are not co-planar with the one or more second semiconductor nanoribbons.

Example 36 includes the subject matter of Example 35, wherein the first semiconductor device is a p-channel device and the second semiconductor device is an n-channel device.

Example 37 includes the subject matter of any one of Examples 31-36, wherein each of the first and second Sn concentrations is between about 10% and about 40% Sn, and the third Sn concentration is between about 40% and about 80% Sn.

Example 38 includes the subject matter of any one of Examples 31-37, wherein the first Sn concentration is within 5% of the second Sn concentration, and the third Sn concentration is at least 10% greater than each of the first and second Sn concentrations.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:
    a first semiconductor device on a substrate and having one or more first semiconductor nanoribbons extending between a first source region and a first drain region;
    a second semiconductor device on the substrate and having one or more second semiconductor nanoribbons extending between a second source region and a second drain region, wherein the one or more first semiconductor nanoribbons are at different staggered heights compared with the one or more second semiconductor nanoribbons;
    a first spacer structure around first ends of the one or more first semiconductor nanoribbons;
    a second spacer structure around second ends of the one or more first semiconductor nanoribbons; and
    a gate structure around the one or more first semiconductor nanoribbons and between the first and second spacer structures;
    wherein at least one nanoribbon of the one or more first semiconductor nanoribbons includes a first region at one end of the nanoribbon having a first germanium (Ge) concentration, a second region at the other end of the nanoribbon having a second Ge concentration, and a third region between the first and second regions, wherein an entirety of the third region has a third Ge concentration greater than each of the first and second Ge concentrations, and wherein a first portion of the third region is beneath the first spacer structure directly adjacent to the first region and a second portion of the third region is beneath the second spacer structure directly adjacent to the second region.

2. The integrated circuit of claim 1, wherein the third region extends through an entire thickness of the nanoribbon.

3. The integrated circuit of claim 1, wherein each of the first and second Ge concentrations is between 10% and 40% Ge, and the third Ge concentration is between 40% and 80% Ge.

4. The integrated circuit of claim 1, wherein the first spacer structure is around the first region of the at least one nanoribbon and the second spacer structure is around the second region of the at least one nanoribbon.

5. The integrated circuit of claim 1, wherein the third region includes a third portion between the first and second portions, wherein a thickness of the third portion is less than a thickness of either the first or second regions of the at least one nanoribbon.

6. A printed circuit board comprising the integrated circuit of claim 1.

7. The integrated circuit of claim 1, wherein the first Ge concentration is within 5% of the second Ge concentration, and the third Ge concentration is at least 10% greater than each of the first and second Ge concentrations.

8. The integrated circuit of claim 1, wherein the first region is directly adjacent to the first source region and the second region is directly adjacent to the first drain region.

9. An electronic device, comprising:
    a chip package comprising one or more dies, at least one of the one or more dies comprising
        a first semiconductor device on a substrate and having one or more first semiconductor nanoribbons extending between a first source region and a first drain region;
        a second semiconductor device on the substrate and having one or more second semiconductor nanoribbons extending between a second source region and a second drain region, wherein the one or more first semiconductor nanoribbons are at different staggered heights compared with the one or more second semiconductor nanoribbons;
        a first spacer structure around first ends of the one or more first semiconductor nanoribbons;
        a second spacer structure around second ends of the one or more first semiconductor nanoribbons; and
        a gate structure around the one or more first semiconductor nanoribbons and between the first and second spacer structures;
        wherein at least one nanoribbon of the one or more first semiconductor nanoribbons includes a first region at one end of the nanoribbon having a first germanium (Ge) concentration, a second region at the other end of the nanoribbon having a second Ge concentration, and a third region between the first and second regions, wherein an entirety of the third region has a third Ge concentration greater than each of the first and second Ge concentrations, and wherein a first portion of the third region is beneath the first spacer structure directly adjacent to the first region and a second portion of the third region is beneath the second spacer structure directly adjacent to the second region.

10. The electronic device of claim 9, wherein the third region extends through an entire thickness of the nanoribbon.

11. The electronic device of claim 9, wherein each of the first and second Ge concentrations is between 10% and 40% Ge, and the third Ge concentration is between 40% and 80% Ge.

12. The electronic device of claim 9, wherein the first spacer structure is around the first region of the at least one nanoribbon and the second spacer structure is around the second region of the at least one nanoribbon.

13. The electronic device of claim 9, wherein the third region includes a third portion between the first and second portions, wherein a thickness of the third portion is less than a thickness of either the first or second regions of the at least one nanoribbon.

14. The electronic device of claim 9, further comprising a printed circuit board, wherein the chip package is attached to the printed circuit board.

15. The electronic device of claim 9, wherein the first region is directly adjacent to the first source region and the second region is directly adjacent to the first drain region.

16. An integrated circuit comprising:
    a semiconductor device having a plurality of semiconductor nanoribbons extending between a source region and a drain region;
    a first spacer structure around first ends of the plurality of semiconductor nanoribbons;

a second spacer structure around second ends of the plurality of semiconductor nanoribbons; and
a gate structure around the semiconductor nanoribbons and between the first and second spacer structures;
wherein at least one nanoribbon of the plurality of semiconductor nanoribbons includes a first region at one end of the nanoribbon having a first tin (Sn) concentration, a second region at the other end of the nanoribbon having a second Sn concentration, and a third region between the first and second regions, the third region having a third Sn concentration greater than each of the first and second Sn concentrations, wherein an entirety of the third region has the third Sn concentration and the third region extends through an entire thickness of the nanoribbon, and wherein a first portion of the third region is beneath the first spacer structure directly adjacent to the first region and a second portion of the third region is beneath the second spacer structure directly adjacent to the second region.

17. The integrated circuit of claim 16, wherein the semiconductor device is a first semiconductor device having one or more first semiconductor nanoribbons, and the integrated circuit further comprises a second semiconductor device having one or more second semiconductor nanoribbons, wherein the one or more first semiconductor nanoribbons are at different staggered heights compared with the one or more second semiconductor nanoribbons.

18. The integrated circuit of claim 17, wherein the first semiconductor device is a p-channel device and the second semiconductor device is an n-channel device.

19. The integrated circuit of claim 16, wherein each of the first and second Sn concentrations is between 10% and 40% Sn, and the third Sn concentration is between 40% and 80% Sn.

20. The integrated circuit of claim 16, wherein the first region is directly adjacent to the source region and the second region is directly adjacent to the drain region.

* * * * *